(12) United States Patent
Woo et al.

(10) Patent No.: US 11,749,764 B2
(45) Date of Patent: Sep. 5, 2023

(54) SOLAR CELL MODULE AND FABRICATING METHODS THEREOF

(71) Applicant: Shangrao Jinko solar Technology Development Co., LTD, Jiangxi (CN)

(72) Inventors: Jeonghun Woo, Seoul (KR); Jungguen Kim, Seoul (KR); Yong Song, Seoul (KR); Daehyun Shin, Seoul (KR); Junghwan Yeom, Seoul (KR); Joonho Jeon, Seoul (KR); Eonjoo Hwang, Seoul (KR)

(73) Assignee: SHANGRAO JINKO SOLAR TECHNOLOGY DEVELOPMENT CO LTD, Jiangxi (CN)

( * ) Notice: Subject to any disclaimer, the term of this patent is extended or adjusted under 35 U.S.C. 154(b) by 0 days.

(21) Appl. No.: 16/125,168

(22) Filed: Sep. 7, 2018

(65) Prior Publication Data

US 2019/0081589 A1    Mar. 14, 2019

(30) Foreign Application Priority Data

Sep. 11, 2017  (KR) ........................ 10-2017-0115977
Sep. 11, 2017  (KR) ........................ 10-2017-0115978

(51) Int. Cl.

| | |
|---|---|
| *H01L 31/0475* | (2014.01) |
| *H01L 31/048* | (2014.01) |
| *H05K 1/02* | (2006.01) |
| *H01L 31/05* | (2014.01) |
| *H05K 1/18* | (2006.01) |
| *H01L 31/0465* | (2014.01) |
| *H02S 30/20* | (2014.01) |
| *H01L 31/02* | (2006.01) |

(Continued)

(52) U.S. Cl.
CPC .......... *H01L 31/0475* (2014.12); *E06B 9/386* (2013.01); *H01L 31/02008* (2013.01);

(Continued)

(58) Field of Classification Search
CPC ............. H01L 31/02008; H01L 31/048; H01L 31/0475; H01L 31/046; H01L 31/0465; H02S 20/26; H02S 30/20
See application file for complete search history.

(56) References Cited

U.S. PATENT DOCUMENTS 6,225,877 B1 *  5/2001  Ozeki .................... H03H 9/605
                                                  333/192
6,317,248 B1 * 11/2001  Agrawal ................. G02F 1/155
                                                  340/438

(Continued)

FOREIGN PATENT DOCUMENTS

| JP | 2009-224598 A | 10/2009 |
|---|---|---|
| JP | 2012-80040 A  | 4/2012 |

(Continued)

OTHER PUBLICATIONS

Machine translation—KR 10-1173419 (Year: 2012).*

*Primary Examiner* — Tamir Ayad
(74) *Attorney, Agent, or Firm* — Tucker Ellis LLP

(57) ABSTRACT

A solar cell module can include a plurality of solar cells, each solar cell among the plurality of solar cells including a first electrode and a second electrode arranged in parallel on a rear surface of a semiconductor substrate; a substrate including a conductive pattern electrically connecting the plurality of solar cells with each other; and a protective film disposed on the plurality of solar cells on a front surface of the substrate, in which the conductive pattern includes: a plurality of conductive portions, each of the plurality of conductive portions being arranged between two adjacent solar cells among the plurality of solar cells, an electrode portion formed on a rear surface of the substrate, and a connection portion connected to the electrode portion and surrounding a side surface of the substrate.

20 Claims, 28 Drawing Sheets

(51) Int. Cl.
*E06B 9/386* (2006.01)
*H02S 20/26* (2014.01)
*E06B 9/24* (2006.01)
*H01L 31/18* (2006.01)
*H02S 20/22* (2014.01)

(52) U.S. Cl.
CPC ........ *H01L 31/048* (2013.01); *H01L 31/0465* (2014.12); *H01L 31/0516* (2013.01); *H02S 30/20* (2014.12); *H05K 1/0213* (2013.01); *H05K 1/181* (2013.01); *E06B 9/24* (2013.01); *E06B 2009/2476* (2013.01); *H01L 31/1876* (2013.01); *H02S 20/22* (2014.12); *H02S 20/26* (2014.12)

(56) References Cited

U.S. PATENT DOCUMENTS

| | | | | |
|---|---|---|---|---|
| 8,044,445 | B2* | 10/2011 | Hayashi | H01L 27/14603 257/288 |
| 2008/0185034 | A1* | 8/2008 | Corio | H01L 31/042 136/246 |
| 2009/0152665 | A1* | 6/2009 | Tseng | H01L 24/97 257/461 |
| 2010/0051085 | A1* | 3/2010 | Weidman | H01L 31/02245 136/244 |
| 2010/0139746 | A1* | 6/2010 | Von Maydell | H01L 31/0516 136/255 |
| 2010/0236603 | A1* | 9/2010 | Menard | G02B 3/0056 136/246 |
| 2012/0176077 | A1* | 7/2012 | Oh | H01M 10/465 320/101 |
| 2014/0264785 | A1* | 9/2014 | Lin | H01L 23/544 257/659 |
| 2015/0129026 | A1* | 5/2015 | Jung | H01L 31/022458 136/256 |

FOREIGN PATENT DOCUMENTS

| | | |
|---|---|---|
| JP | 4947660 B2 | 6/2012 |
| JP | 2013-84660 A | 5/2013 |
| KR | 10-2012-0080336 A | 7/2012 |
| KR | 10-1173419 B1 | 8/2012 |
| KR | 10-2015-0145148 A | 12/2015 |

* cited by examiner

SOLAR CELL MODULE AND FABRICATING METHODS THEREOF

CROSS-REFERENCE TO RELATED APPLICATION

This application claims the benefit of priority of Korean Patent Application No. 10-2017-0115977 filed in the Republic of Korea on Sep. 11, 2017, and Korean Patent Application No. 10-2017-0115978 filed in the Republic of Korea on Sep. 11, 2017, all of these applications are hereby incorporated by reference in their entireties.

BACKGROUND OF THE INVENTION

Field of the Invention

The present invention relates to a solar cell module, and more particularly, to a solar cell module having an improved electrode structure for facilitating connection between solar cell modules and a manufacturing method thereof.

Description of the Related Art

With the recent depletion of existing energy sources, such as oil and coal, interest is increasing in alternative energy sources to replace them. Among them, a solar cell is attracting attention as a next generation source, which converts solar energy into electric energy.

Solar cells have been used mainly for large-scale solar power generation through solar power generation, but nowadays, they have been widely used, such as installing them on the outer walls and windows of buildings.

For example, the blinds installed to cover the sunlight in the windows of a building have been used only to cover the sunlight until now, but recently it has also been used as an interior means of reversing the atmosphere inside the building. In recent years, a solar cell module is installed and used for solar power generation. Hereinafter, a blind with a solar cell module is referred to as a solar blade.

Blinds are generally configured to vertically or horizontally overlap a plurality of blades and fold the blades into a foldable or movable form to block light. In comparison, solar blinds have a similar basic structure as blinds (e.g., window blinds), but they are constructed so that the blinds can be used for photovoltaic power generation by installing an additional solar cell module to direct the sunlight to the blades.

When the solar blind is constructed, it is necessary to install the solar cell module on the blade in order to facilitate the installation and management of the solar cell module. However, when the solar cell module is installed on the blade, it is not easy to connect the solar cell modules because the space for mounting the solar cell module is narrow and limited (e.g., each blind may only have a long and narrow surface).

SUMMARY OF THE INVENTION

The present invention has been made in view of such a background, and it is an object of the present invention to provide a solar cell module that can be easily connected to a solar blind.

In an embodiment, the solar cell module includes a plurality of solar cells having a first electrode and a second electrode arranged in parallel on a rear surface of a semiconductor substrate, a substrate having a conductive pattern connecting the plurality of solar cells, and a protective film sealing the plurality of solar cells on the front surface of the substrate, in which the conductive pattern includes a plurality of conductive portions arranged to respectively face a portion of the neighboring first solar cell and a portion of the second solar cell of the plurality of solar cells, an electrode portion formed on a rear surface of the substrate, and a connection portion connecting between the conductive portion and the electrode portion and surrounding the side surface of the substrate.

In another embodiment, the solar cell module includes a plurality of solar cells having a first electrode and a second electrode arranged in parallel on a rear surface of a semiconductor substrate, a substrate having a conductive pattern connecting the plurality of solar cells, and a protective film sealing the plurality of solar cells on the front surface of the substrate, in which the conductive pattern includes a plurality of conductive portions arranged to respectively face a portion of the neighboring first solar cell and a portion of the second solar cell of the plurality of solar cells, and a plurality of conductive portions formed on the front surface of the substrate and disposed adjacent to one of the plurality of conductive portions.

According to an embodiment of the present invention, since the conductive pattern is formed only on the front surface of the substrate, it is possible to more effectively prevent moisture from penetrating into the module as compared with when the conductive pattern is connected via the conventional through hole. In addition, since the electrodes are disposed on the front surface of the solar cell module, there is an advantage that connection between the modules can be facilitated.

DETAILED DESCRIPTION OF THE EMBODIMENTS

Figure 1:
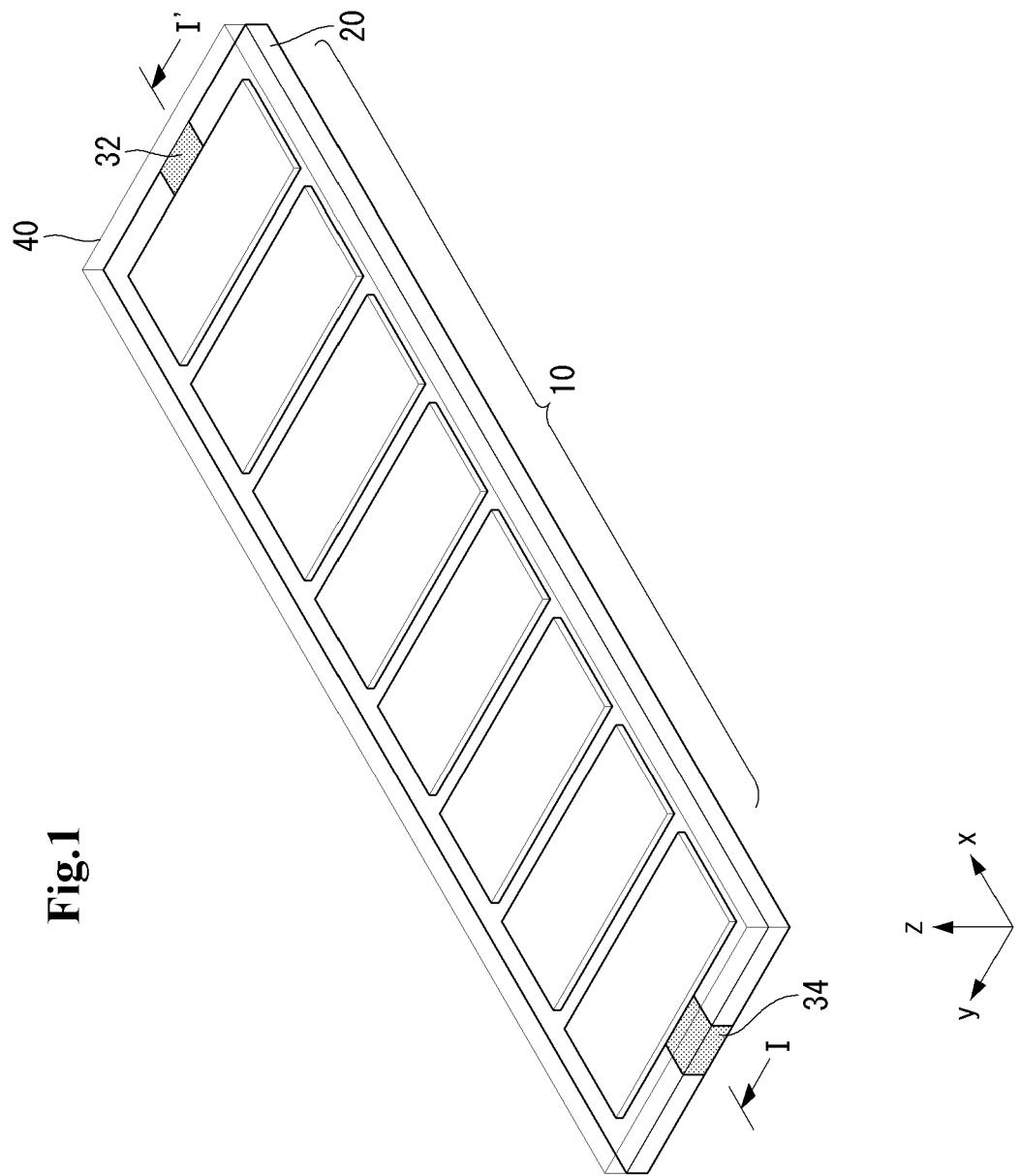
FIG. 1 shows an overall view of a solar cell module according to an embodiment of the present invention.

Reference will now be made in detail to implementations of the disclosure, examples of which are illustrated in the accompanying drawings.

This disclosure may, however, be implemented in many different forms and should not be construed as limited to the implementations set forth herein. Wherever possible, the same reference numbers will be used throughout the drawings to refer to the same or like parts. It will be noted that a detailed description of known arts will be omitted if it is determined that the detailed description of the known arts can obscure the implementations of the disclosure. In addition, the various implementations shown in the drawings are illustrative and may not be drawn to scale to facilitate illustration. The shape or structure can also be illustrated by simplicity.

Hereinafter, a solar cell module according to an embodiment of the present invention will be described with reference to the accompanying drawings.

Figure 2:
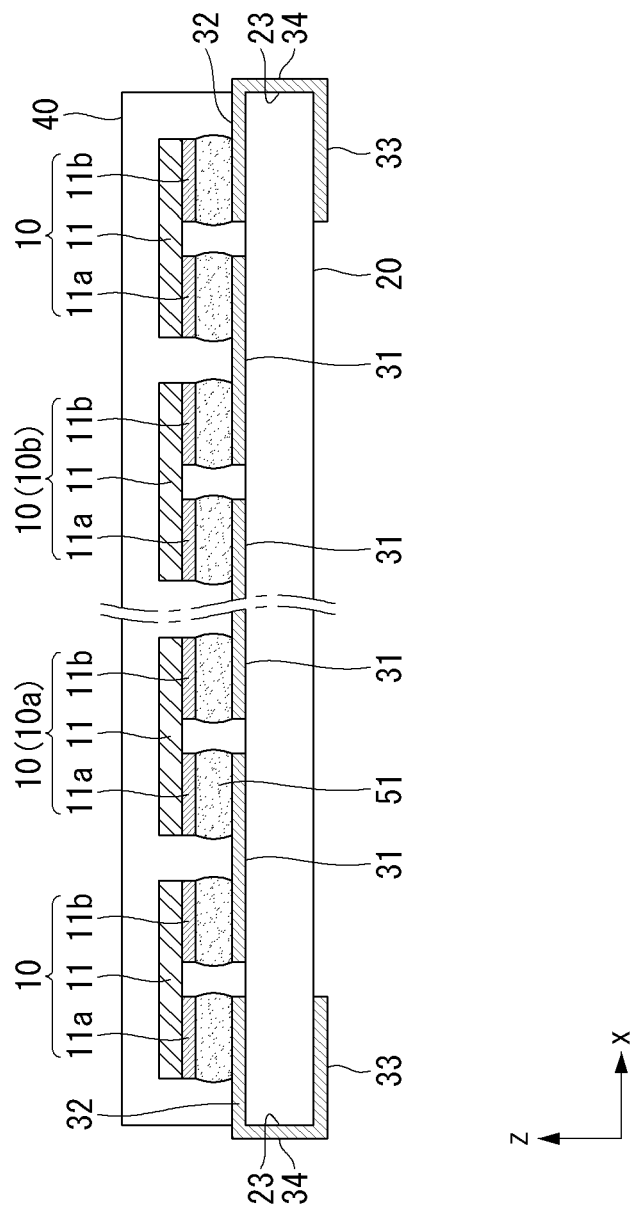
FIG. 2 schematically shows a cross section taken along a line I-I' in FIG. 1 according to an embodiment of the present invention.
Figure 3:
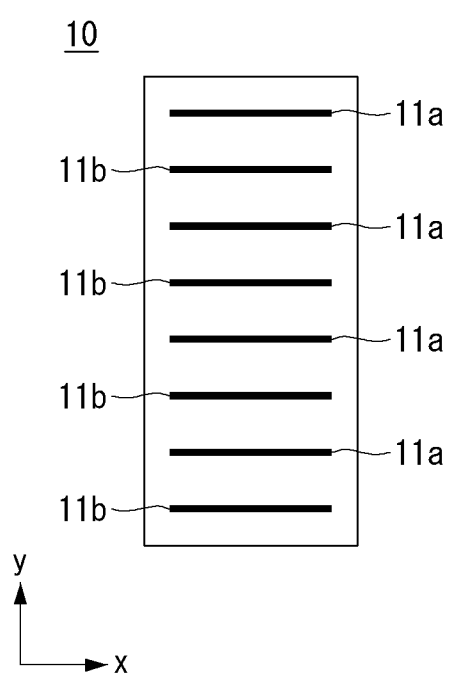
FIG. 3 shows a rear surface of a solar cell according to an embodiment of the present invention.

FIG. 1 shows an overall view of a solar cell module according to a first embodiment of the present invention and FIG. 2 schematically shows a cross section taken along a line I-I' in FIG. 1. Here, FIG. 2 may schematically show the positions of the first electrode and the second electrode differently from the actual ones for convenience of explanation, and the actual electrode arrangement of the solar cell can be as shown in FIG. 3.

The solar cell module of the present invention preferably relates to a solar cell module for a blind installed in a solar blind. In this instance, since the solar cell module is installed on the blade in the solar blind to form the appearance of the blind, the convenience of connection between the solar modules and the design elements should be considered.

For convenience of connection, in embodiments of the present invention, an electrode is configured to be exposed to the outside to facilitate connection between solar cell modules, and a design element is considered, so that a solar cell having a front surface of the module can be configured not to be visible from the outside.

The solar cell module of the first embodiment includes a plurality of solar cells 10 (e.g., a plurality of small sized solar cells), a substrate 20 connecting the solar cells 10 to each other, and a protective film 40 formed on the front surface of the substrate 20 to seal the solar cells 10.

In an embodiment, the solar cell 10 includes a first electrode 11a and a second electrode 11b which collect different charges, both of which are arranged on one side of the semiconductor substrate 11, such as back contact solar cell or MWT (Metal Wrap Through) solar cell.

In the first embodiment, a plurality of solar cells 10 are mounted on the substrate 20 and electrically connected to each other. The reason why the divided solar cells are mounted on one substrate 20 is that the total output loss of the solar cell module can be reduced. The output loss has a value obtained by multiplying the square of the current in the solar cell by the resistance, and a current generated by the area of the solar cell itself exists in the current of the solar cell. Therefore, when the area of the solar cell is increased, the corresponding current is also increased, and when the area of the solar cell is decreased, the corresponding current is also decreased. Therefore, as the area of the solar cell decreases, the output loss can be reduced. Therefore, when the solar cells are divided into smaller units and connected to each other as in the embodiment of the present invention, the output of the solar cells can be increased more than that of one large solar cell formed on the entire substrate.

Since the solar cell 10 is electrically connected to the substrate 20 in a state of being mounted on the substrate 20, the solar cell module can be constructed to have mechanical strength, and a plurality of solar cells 10 can be easily and simply connected. In this embodiment, since the first and second electrodes 11a and 11b provided on the solar cell are formed on the rear surface of the semiconductor substrate 11, the solar cell 10 can be bonded to the substrate 20 using flip chip bonding, so that the solar cell module can be easily manufactured.

The substrate 20 includes a conductive pattern 30 for electrically connecting a plurality of solar cells 10 mounted on the substrate 20.

The conductive pattern 30 can be formed on the substrate 20 by printing a conductive material, such as copper. The substrate 20 can be implemented as a printed circuit board, referred to as a PCB (Printed Circuit Board) substrate. Such a printed circuit board is printed with a conductive pattern of copper on the surface thereof, and can be used as the substrate 20.

In an embodiment, the conductive pattern 30 is covered by an insulating layer formed on the substrate and can be configured to selectively expose only the portion through the contact hole. The conductive pattern 30 can be exposed by the contact hole and selectively connected to the electrodes of the solar cell by the solder 51 or the conductive adhesive.

In FIG. 2, the insulating layer is omitted in order to show the bonding relation between the conductive pattern 30 and the first and second electrodes 11a and 11b.

In an embodiment, the conductive pattern 30 includes a plurality of conductive portions 31 which connect neighboring first and second solar cells 10a and 10b of the plurality of solar cells, a terminal portion 32 disposed adjacent to the conductive portion 31 at the edge of the substrate 20, an electrode portion 33 formed at the rear side edge of the substrate, and a connection portion 34 formed to surround the side surface 23 of the substrate 20 and electrically connecting the terminal portion 32 with the electrode portion 33.

In the first embodiment, the electrode portion 34 functioning as an electrode (for external load connection) is connected to the terminal portion 32 formed on the front surface of the substrate 20 by the connecting portion 34 formed to surround the side surface of the substrate 10.

Therefore, water contamination can be more effectively prevented than a method in which a through hole is formed in the substrate 20 through the substrate to connect the electrode portion 34 and the terminal portion 32.

That is, in the related art, the conductive patterns formed on the front and back surfaces of the substrate are connected using a through hole.

However, in the related art, water may flow into the front surface of the substrate through the through hole, and as a result, the conductive pattern or the electrode may be exposed to moisture and cause corrosion.

However, according to one embodiment of the present invention, since the through hole is not formed in the substrate, the problem of penetration of moisture by the through hole can be fundamentally prevented.

Further, a transparent protective film 40 is formed on the front surface of the substrate 20 to seal a plurality of solar cells. The protective film 40 may be formed of a transparent polymer such as ethylene-vinyl acetate (EVA) or ethylene tetrafluoroethylene (ETFE), and is preferably formed only on the front surface. In one embodiment of the present invention, the electrode portion is formed on the rear surface of the substrate 20, and the protective film 40 is formed only on the front surface of the substrate 20 in consideration of design elements.

Further, in an embodiment of the present invention, the end of the protective film 40 and the end of the substrate 40 are located on the same line (e.g., aligned with each other), so that the design of the solar cell module can be improved.

In an embodiment of the present invention, the end of the protective film 40 and the end of the substrate 40 are located on the same line so that the solar cell module can be configured to have a simple appearance. Such a shape can be formed by attaching the protective film 40 to the entire surface of the substrate 20, and then cutting the substrate 20 and the protective film 40 together.

FIG. 3 shows a rear surface of a solar cell used in the first embodiment of the present invention.

As exampled in FIG. 3, in one embodiment of the present invention, the first electrode 11a and the second electrode 11b are elongated in a first direction (x-axis direction in the figure) and are arranged in parallel with the neighboring one. In the second direction (y-axis direction in the figure), the first electrode 11a and the second electrode 11b can be alternately arranged.

Figure 4:
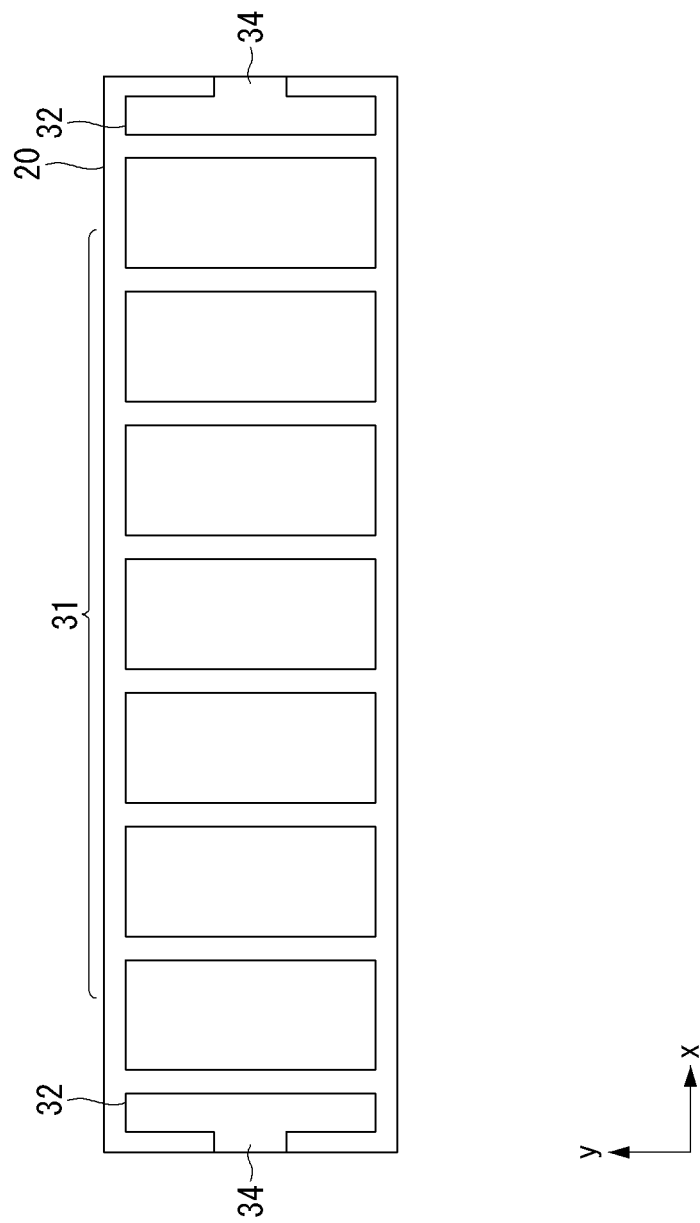
FIGS. 4 and 5 show conductive patterns formed on the front and rear surfaces of the substrate according to an embodiment of the present invention, respectively.
Figure 5:
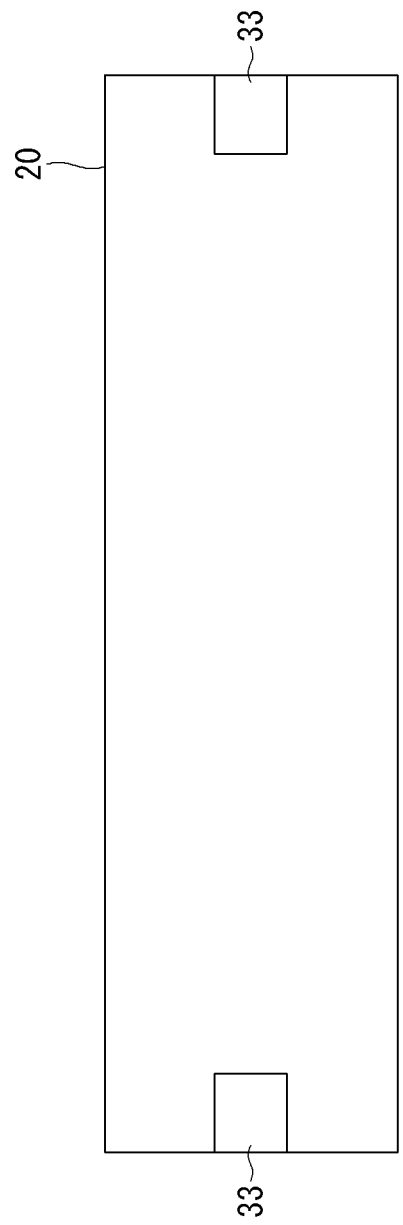

FIGS. 4 and 5 show conductive patterns formed on the front and rear surfaces of the substrate according to the first embodiment, respectively. Referring to FIGS. 4 to 5, in the first embodiment of the present invention, the conductive pattern 30 includes a conductive portion 31, a terminal portion 32 disposed on the front surface of the substrate 20, an electrode portion 33 disposed on the rear surface of the substrate 20, and a connection portion 34 formed to surround the side surface of the substrate.

The terminal portion 32 has a flat plate shape and is formed adjacent to the side edge of the substrate 20.

A plurality of conductive portions 31 are formed between a pair of terminal portions 32 formed on both side surfaces of the substrate 20 and are physically separated from each other. The conductive portion 31 can have a flat shape similar to the terminal portion 32 and can have a wider area than the terminal portion 32.

The electrode portion 33 is formed on the rear surface of the substrate 20. The electrode portion 33 functions as an electrode of a conductive pattern for connecting the solar cell module to an external load.

The electrode portion 33 can be disposed adjacent to a side edge of the rear surface of the substrate 20.

As shown in the figures, each of the plurality of conductive portions 31 and the terminal portion 32 formed on the front surface of the substrate are physically separated from each other. In embodiments of the present invention, the solar cells are disposed between the conductive portion 31 and the conductive portion 31 (e.g., as a bridge between two adjacent conductive portions 31) or between the conductive portion 31 and the terminal portion 32 to be electrically connected to each other.

The connection portion 34 is formed to surround the side surface 23 of the substrate 20 and electrically connect the terminal portion 32 positioned on the front surface of the substrate 20 and the electrode portion 33 positioned on the rear surface.

In an embodiment, the electrode portion 33 formed on the rear surface of the substrate 20 can have various shapes.

Figure 6:
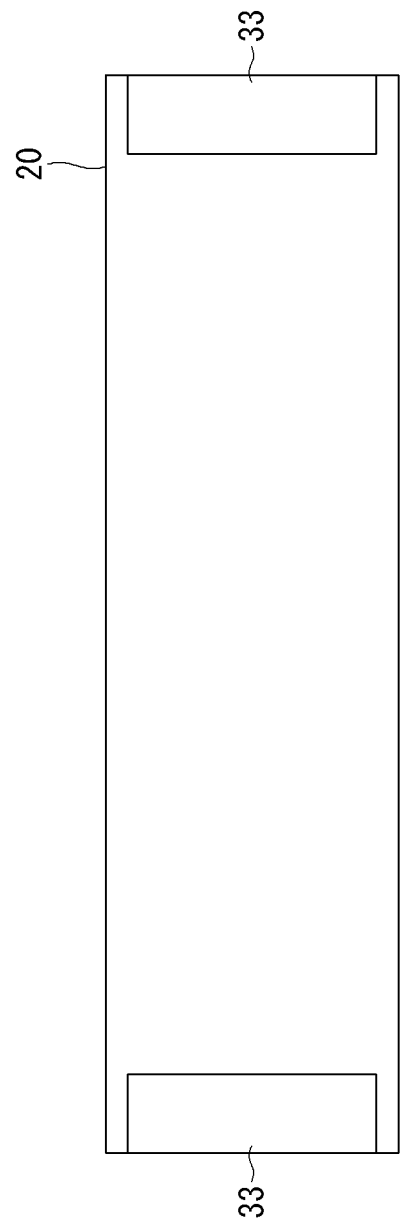
FIGS. 6 and 7 show other examples of the electrode portion according to embodiments of the present invention.
Figure 7:
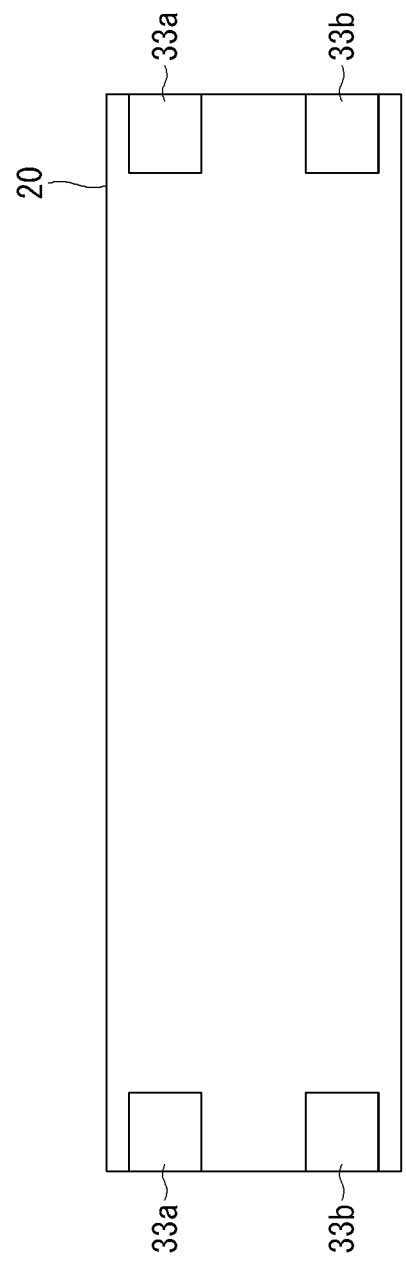

For example, it can have a shape as illustrated in FIGS. 6 and 7 in addition to the example illustrated in FIG. 5.

In the example of FIG. 6, the electrode portion 33 can be formed on the entire edge of the rear surface of the substrate 20 (e.g., the electrode portion 33 can be as long as or nearly as long as a width of the substrate).

When the electrode portion 33 is formed on the entire edge of the rear surface of the substrate 20 as described above, since the area of the electrode portion 33 is wide, it is easy to connect the modules and the contact resistance is reduced. Thus, the efficiency can be increased.

Alternatively, as shown in FIG. 7, the electrode portion 33 can be composed of a plurality of electrode portions 33, respectively. If a solar cell module has a plurality of electrode portions 33, the solar cell module can be more easily wired with the neighboring solar cell module.

For example, when a solar cell module is disposed above the substrate 20, the solar cell module can be connected via the electrode portion 33a disposed at the upper side, and when the solar cell module disposed below the substrate, the solar cell module can be connected via the electrode portion 33b disposed at the lower side.

In such an example, the intervals between the modules are reduced by selecting different electrode portions 33a and 33b to be connected according to the module position, so that the wiring can be easily arranged (e.g., shorter wires can be used to connect modules).

Figure 8:
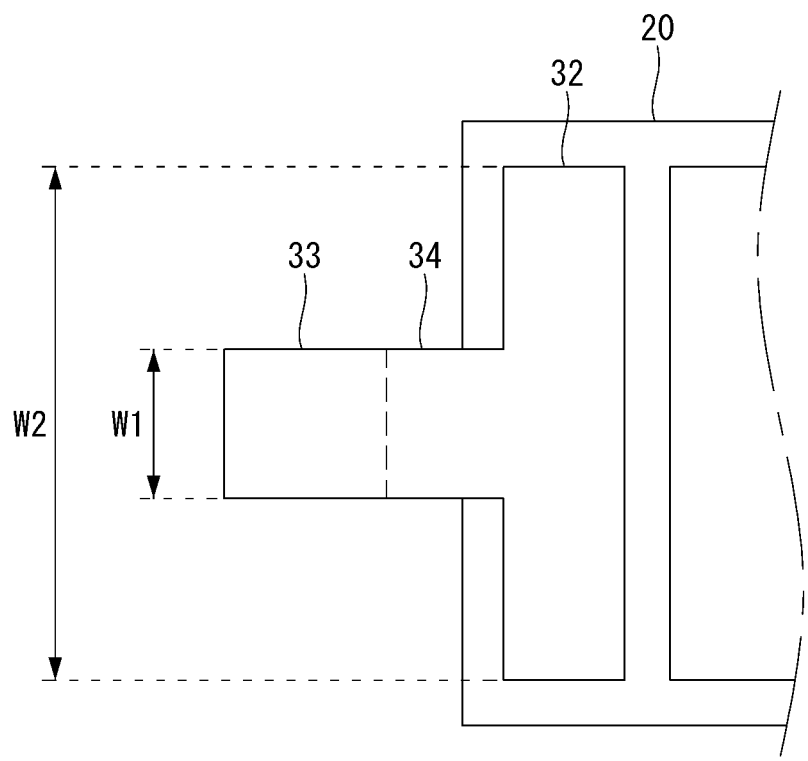
FIGS. 8 to 10 are various examples showing the conductive patterns laid out in the same plane according to embodiments of the present invention.
Figure 9:
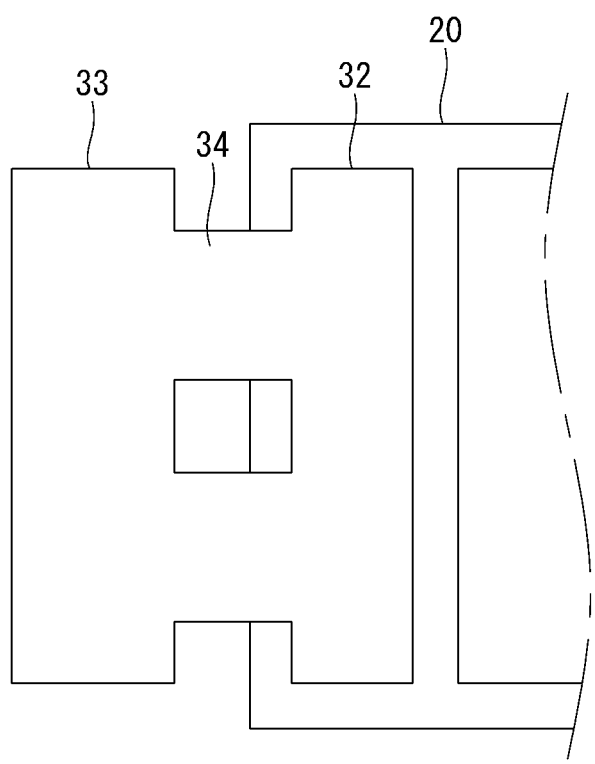
Figure 10:
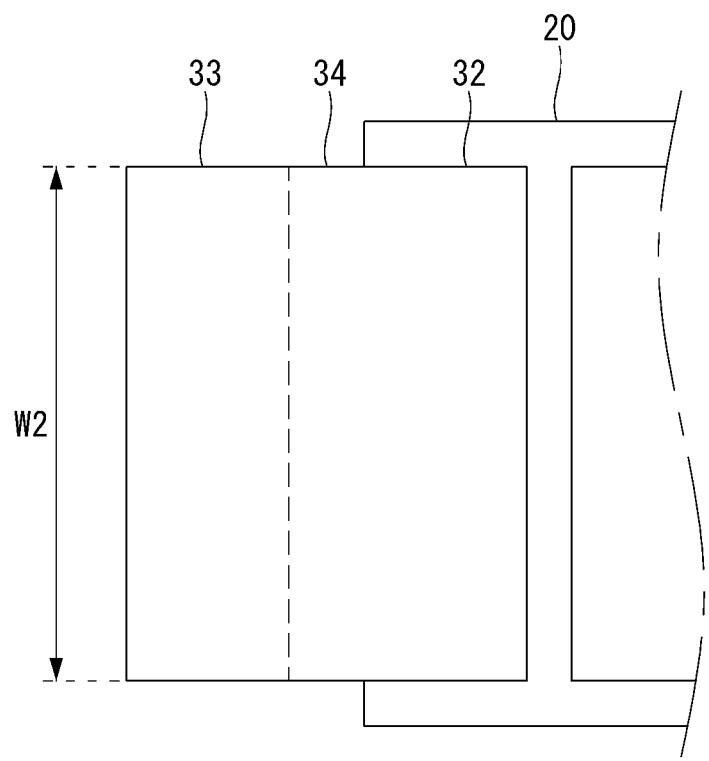

FIGS. 8 to 10 are various examples showing the conductive patterns laid out in the same plane.

Referring to FIGS. 8 to 10, in one example, the connection portion 34 can be formed to have the same line width W1 as the electrode portion 33. When the connection portions 34 and the electrode portions 33 have the same line width, there is an advantage that the forming the conductive patterns is easier than in the situation where the line widths are different.

The line width W1 of the connection portion 34 can be smaller than the line width W2 of the terminal portion 32.

In addition, in one example, the connection portion 34 can be composed of at least two or more connections portions. In FIG. 9, it is shown that connection portion 34 is composed of two parts. Since the plurality of connection portions 34 are formed in this manner, it is possible to overcome the problem that the connection portions are disconnected.

In other words, the conductive patterns formed on the front and rear surfaces of the substrate 20 in the first embodiment of the present invention are connected to each other by the connection portions 34 formed on the side surface of the substrate 20, unlike the related art situation of connecting through via holes. However, since the connection portion 34 is located on the side surface of the substrate 20, the connection portion 34 can be broken by physical friction. In this embodiment, the terminal portion 32 and the electrode portion 33 are connected by a plurality of connecting portions 34 in consideration of this problem.

In an embodiment, as shown in FIG. 10, the line width W2 of the connection portion 34 and the electrode portion 33 may be the same as the line width W2 of the terminal portion 32.

Figure 11:
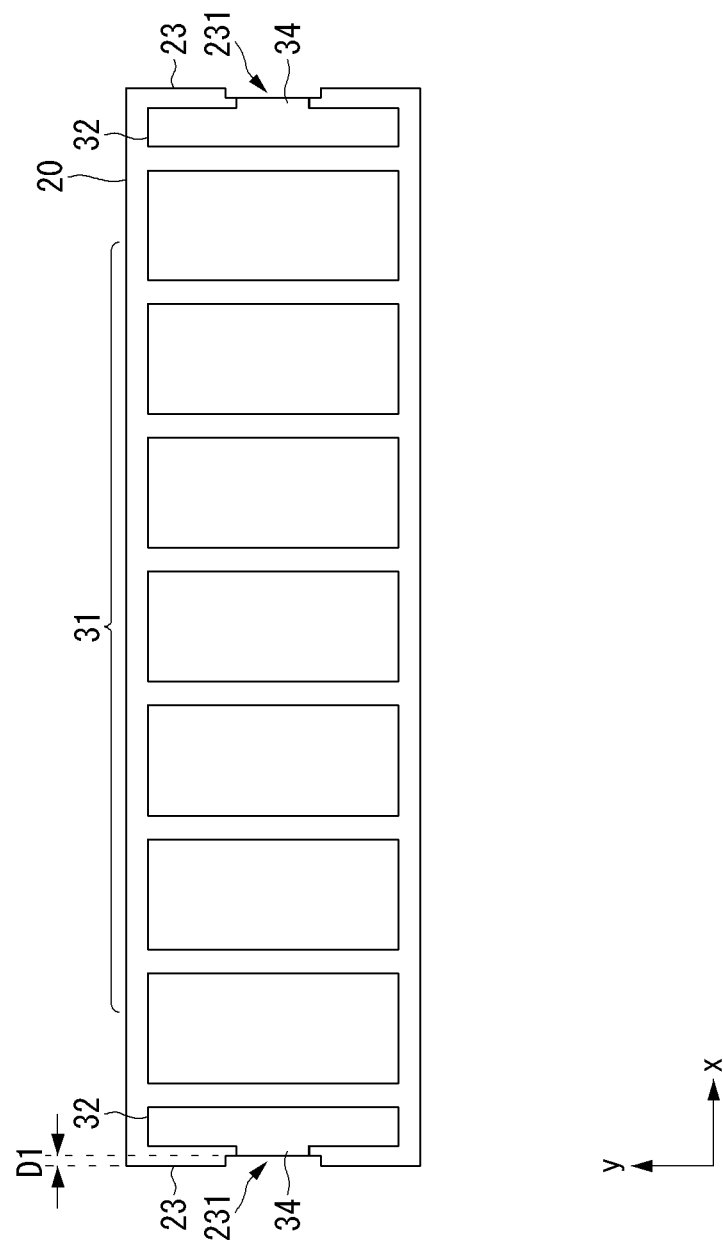
FIG. 11 shows an example of the substrate according to an embodiment of the present invention.

FIG. 11 shows another example of the substrate according to an embodiment.

The conductive pattern shown in FIG. 11 has a same structure as explained above except for a groove portion 231.

In this example, the substrate 20 differs from the above-described examples in that it is further comprised of a groove portion 231 formed in a side surface 23.

The groove portion 231 concaves inwardly of the substrate 20, and the connecting portion 34 can be disposed in the groove portion 231.

The depth D1 of the groove portion 231 is at least equal to or greater than the thickness of the conductive pattern or the connecting portion 34 of the conductive pattern. Accordingly, when the connection portion 34 is disposed in the groove portion 231, the connection portion 34 may not protrude beyond the side surface of the substrate.

Therefore, even if the conductive pattern is formed on the side surface 23 of the substrate 20, it is possible to prevent the connection portion 34 from being damaged due to physical friction or the like, since it protected within the groove pattern 231. Further, in the process of manufacturing the solar cell module, the solar cell module is not damaged. This will be described later in detail while explaining the manufacturing method.

Figure 12:
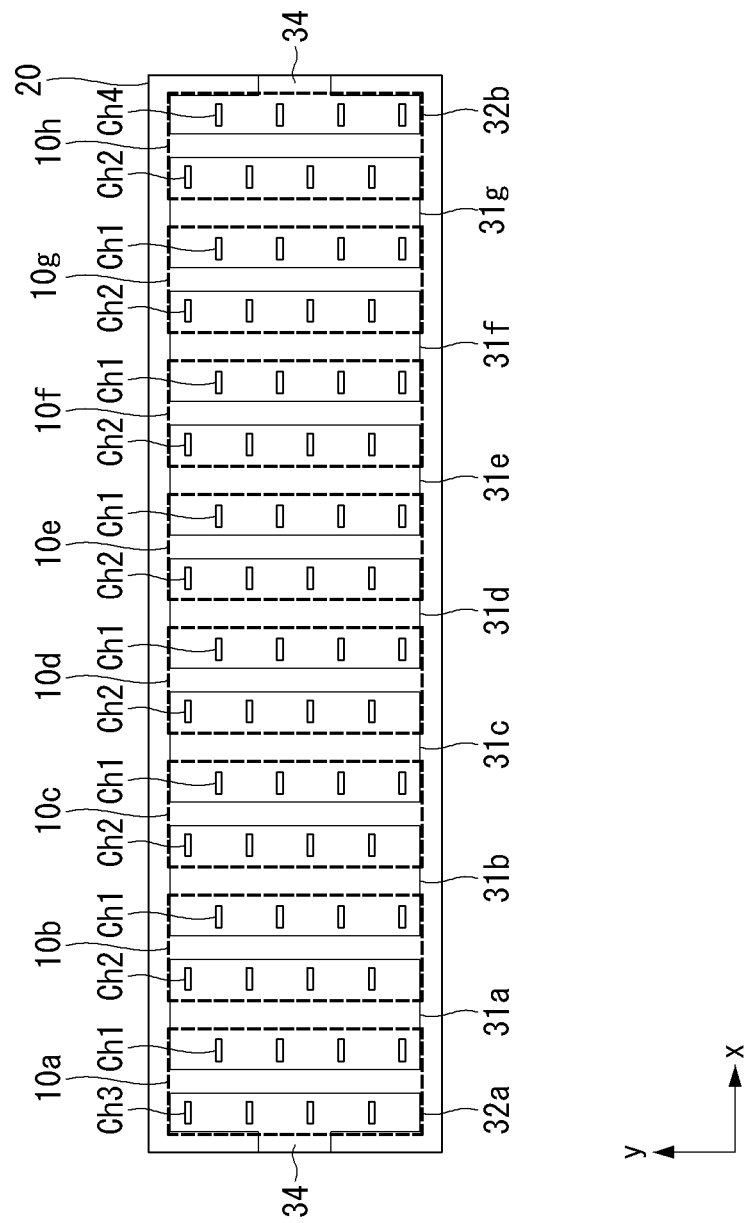
FIG. 12 is a view showing a layout where a solar cell is disposed on a conductive pattern according to an embodiment of the present invention.

FIG. 12 is a view showing a layout where a solar cell is disposed on a conductive pattern. Hereinafter, with reference to this drawing, how a plurality of solar cells are connected by a conductive pattern will be described in detail.

In the following description, a plurality of solar cells arranged on the substrate 20 are referred to as first to eighth solar cells 10a to 10h in order, and the plurality of conductive portions are also referred to as first to seventh conductive portions 31a to 31g.

As described above, the entire surface of the substrate 20 is formed with terminal portions 32a and 32b and a plurality of conductive portions 31a to 31g therebetween, and an insulating layer covers the conductive portions 31a to 31g. The insulating layer includes a plurality of contact holes that respectively expose a part of the conductive portion and a part of the terminal portions 32a and 32b.

The contact holes include first and second contact holes Ch1 and Ch2 formed on each of the plurality of conductive portions 31a to 31g, and third and fourth contact holes Ch3 and Ch4 formed on the first and second terminal portions 32a and 32b.

A plurality of first contact holes Ch1 are formed to expose a part of the left side of each of the conductive portions 31a to 31g, and are formed to be separated from each other by a constant distance in a second direction (y-axis direction in the figure). The constant distance refers to substantially the same distance as the distance between the second electrodes or between the first electrodes.

The plurality of second contact holes Ch2 are formed to expose a part of the right side of each of the conductive portions 31a to 31g and are formed to be separated by a predetermined distance in a second direction (y-axis direction in the figure). The constant distance refers to substantially the same distance as the distance between the second electrodes or between the first electrodes.

The first contact hole Ch1 and the second contact hole Ch2 are not located on the same line in a first direction (the longitudinal direction of the electrode in the x-axis direction of the drawing), and are shifted by a constant distance. The shifted distance is substantially equal to the distance between the first electrode and the second electrode.

Accordingly, the first contact hole ch1 and the second contact hole Ch2 are located alternately in the second direction like the first electrode and the second electrode, and the distance between the first contact hole ch1 and the second contact hole Ch2 is equal to the distance between the first electrode and the second electrode.

Since the alternating order and spacing of the first electrode and the second electrode formed on the solar cell are the same as those of the first contact Ch1 and the second contact Ch2, in each of the plurality of solar cells, the first electrode and the second electrode can be connected to the conductive portion through the first and second contact holes (Ch1, Ch2), respectively.

The contact hole also includes third and fourth contact holes Ch3, Ch4 for exposing each of the terminal portions 32a, 32b. Here, the third contact ch3 is formed on the first terminal portion 32a, and the fourth contact ch4 is formed on the second terminal portion 32b.

In an embodiment, the third contact ch3 is located on the same line as the second contact Ch2, and the fourth contact Ch4 is positioned on the same line as the first contact Ch1 in the first direction, respectively.

The second to seventh solar cells 10b to 10g of the plurality of solar cells 10a to 10h are connected to each other by a conductive portion.

For example, the left part of the second solar cell 10b is located on the right side of the first conductive portion 31a, and the right side part of the second solar cell 10b is located on the left side of the second conductive portion 31b. In this state, in the second solar cell 10b, the second electrode 11b is connected to the first conductive portion 31a by the second contact ch1 provided on the right side of the first conductive portion 31a and the first electrode 11a is connected to the second conductive portion 31b by the first contact hole Ch1 provided on the left side of the second conductive portion 31b.

The third solar cell 10c adjacent to the second solar cell 10b is located on the right side of the second conductive portion 31b and on the left side of the third conductive portion 31c (e.g., arranged like a bridge between adjacent conductive portions). In this state, the second electrode 11b of the third solar cell 10c on the right side of the second conductive portion 31c is connected to the second conductive portion 31b by the second contact ch2. Accordingly the second and third solar cells 10b and 10c are connected in series by the second conductive portion 31b.

With this connection method, the second to seventh solar cells 10b to 10g are also connected in series by the second to sixth conductive portions.

The first solar cell 10a is positioned to overlap with a first terminal portion 31a and the left portion of the first conductive portion 31a.

Same as the connection method described above, the first electrode 11a of the first solar cell 10a disposed at the first of the plurality of solar cells is connected to the first conductive portion 31a through the first contact hole Ch1, As a result, the first solar cell 10a is connected in series with the second solar cell 10b.

The second electrode 11b of the first solar cell 10a is connected to the first terminal portion 32a through the third contact Ch3.

The eighth solar cell 10h disposed at the end of the plurality of solar cells is located on the right side of the seventh conductive portion 31g and on the second terminal 32b. The second electrode of the eighth solar cell 10h is connected to the seventh conductive portion 31g by the second conductive portion Ch2 formed on the right side of the seventh conductive portion 31g, and the first electrode of the first contact portion 10h is connected to the second terminal portion 32b by the fourth contact Ch4.

The first to eighth solar cells 10a to 10h arranged in the row are connected in series by the first to seventh conductive portions 31a to 31g. The first solar cell 10a is connected to the first terminal and the eighth solar cell 10b can be connected to the second terminal 32b.

Hereinafter, a method of manufacturing the above-described solar cell module will be described.

Figure 13:
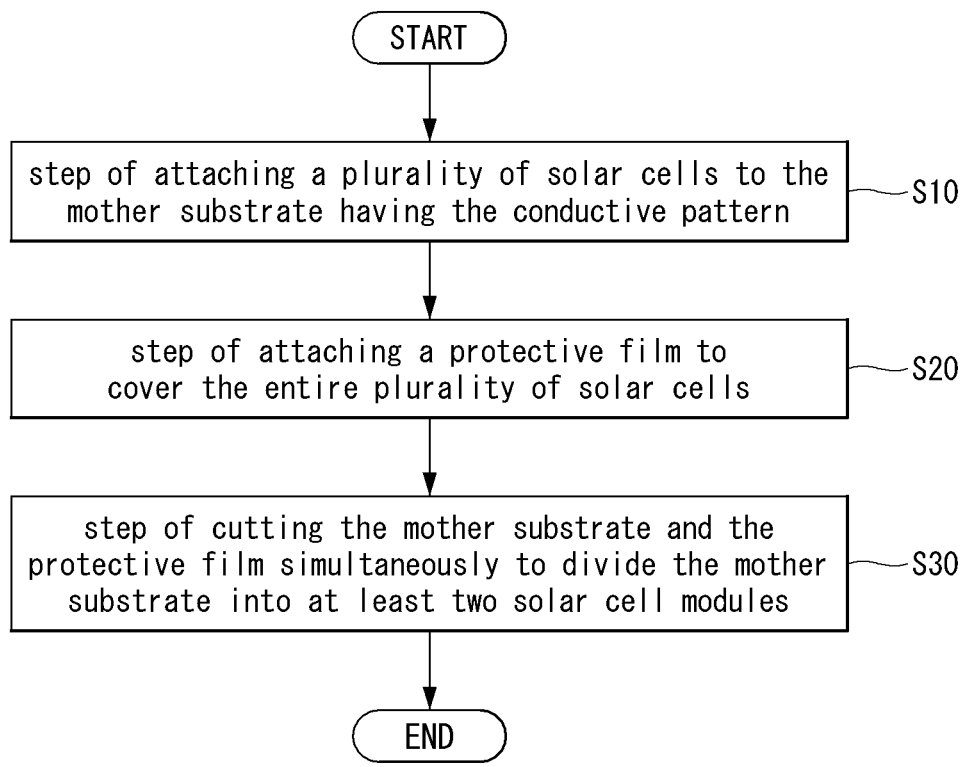
FIG. 13 is a flowchart illustrating a method of manufacturing a solar cell module according to the fan embodiment of the present invention.

FIG. 13 is a flowchart illustrating a method of manufacturing a solar cell module according to the first embodiment of the present invention.

As shown in FIG. 13, the manufacturing method of the solar cell module according to the first embodiment of the present invention includes the step S10 of attaching a plurality of solar cells to the mother substrate having the conductive pattern described above, the step S20 of attaching a protective film to cover the entire plurality of solar cells, and the step S30 of cutting the mother substrate and the protective film simultaneously to divide the mother substrate into at least two solar cell modules.

In step S10, the solar cells can be attached to the mother substrate through reflow soldering or flow soldering.

In the reflow soldering, a cream-like solder (or called a solder cream) is printed as a conductive pattern formed on the mother substrate, and a plurality of solar cells are placed thereon and moved to a hot air circulating apparatus. In the hot air circulating apparatus, the solar cell is soldered to the mother substrate.

Figure 14:
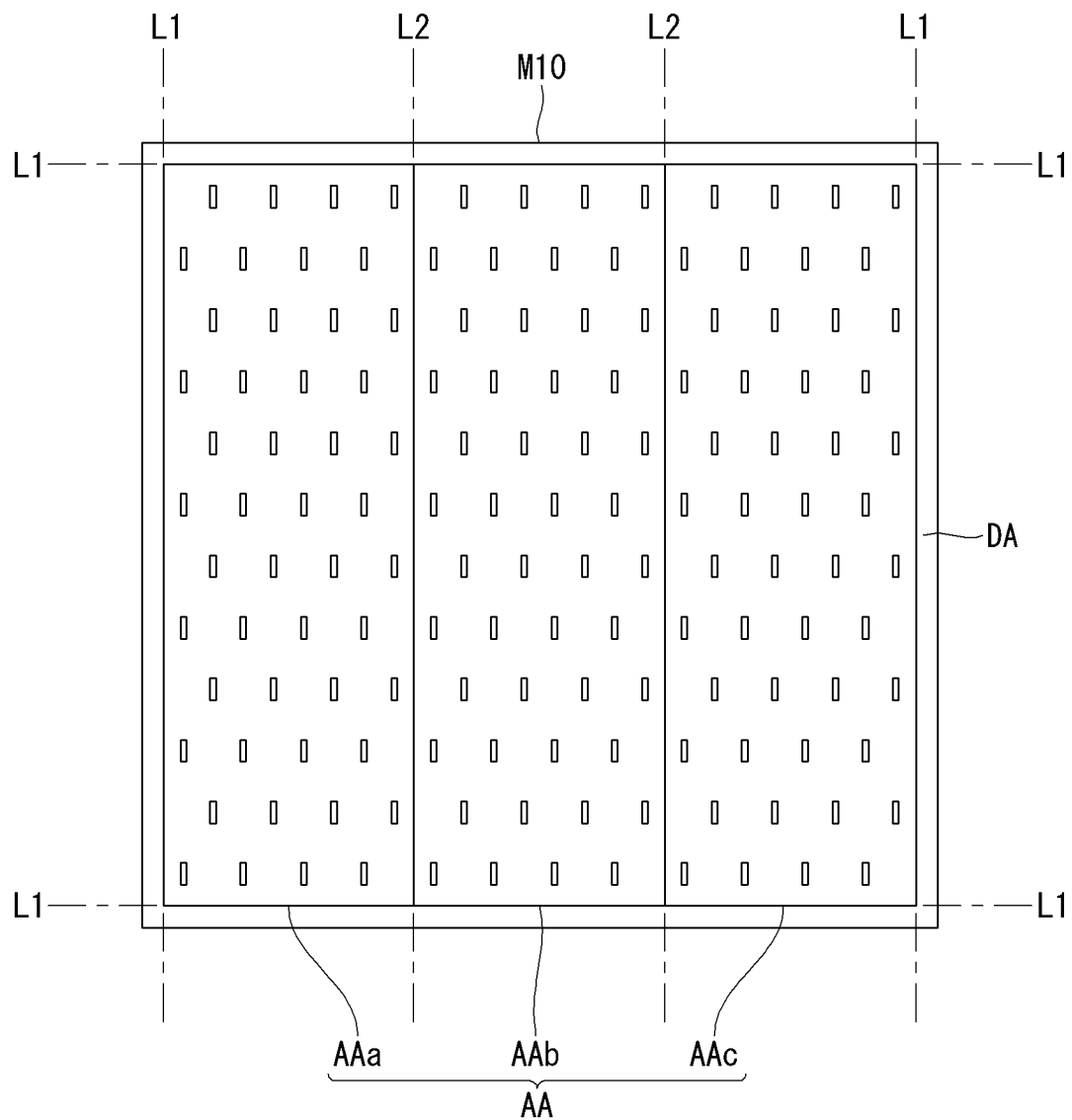
FIGS. 14 and 15 show examples of a mother substrate used in the manufacturing method of FIG. 13 according to embodiments of the present invention.

FIG. 14 is a plan view of the mother substrate discussed in FIG. 13.

As shown in FIG. 14, the mother substrate M10 can be composed of a printed circuit board. The mother substrate M10 can include an active area AA in which the solar cell is mounted and a dummy area DA surrounding the periphery of the active area AA. The dummy area DA is removed from the mother substrate M10 in the step S30 of dividing the mother substrate M10 into a plurality of solar cell modules. The dummy area DA is an area for allowing a process margin.

In addition, the active area AA can be divided into a plurality of cells AAa to AAc. Each cell is a part where the above-described solar cell module is made, and the mother substrate M10 can be used as a base substrate for making a plurality of solar cell modules.

In the step S10, solar cells are mounted on the mother substrate M10 along a conductive pattern formed on each of the cells AAa to AAc. In one example, the solar cells can be mounted on the mother substrate M10 through reflow soldering.

In step S20, the protective film 40 is attached to the front surface of the mother substrate 100, that is, the surface on which the sun faces. At this time, it is preferable that the protective film 40 is adhered not only to the active area AA but also to the dummy area DA.

In an embodiment, the protective film 40 can be laminated to the substrate 20 in a vacuum. This vacuum laminating is performed in a chamber equipped with a vacuum facility. After the chamber is vacuumed to a certain level or higher, the protective film 40 is adhered to the entire surface of the substrate by thermo-compression using a laminating apparatus. Therefore, the protective film 40 can be adhered to the substrate 20 in a clean manner by preventing pollutants from flowing in the laminating process.

Next, in step S30, the mother substrate M10 is divided into a plurality of solar cell modules. The mother substrate M10 is divided into a plurality of solar cell modules by mechanical cutting using a saw, a method of using a punching device for forming fine holes in the substrate, or a method of using a laser and or various cutting methods.

The mother substrate M10 can be cut along the first cutting line L1 and the second cutting line L2 as illustrated in FIG. 14. The first cut line L1 divides the active area AA and the dummy area DA and the second cut line L2 divides the plurality of cells AAa to AAc belonging to the active area AA.

Further, the mother substrate M10 is mechanically cut along the first and second cutting lines L1 and L2 by moving a cutting tool, e.g., a saw. In the solar cell module according to an embodiment of the present invention, the conductive patterns formed on the front and back surfaces of the substrate are connected to each other through the conductive patterns 34 formed on the side surfaces of the substrate 20. Therefore, the connection portion 34 formed on the side surface of the substrate may be damaged during the cutting process.

Figure 15:
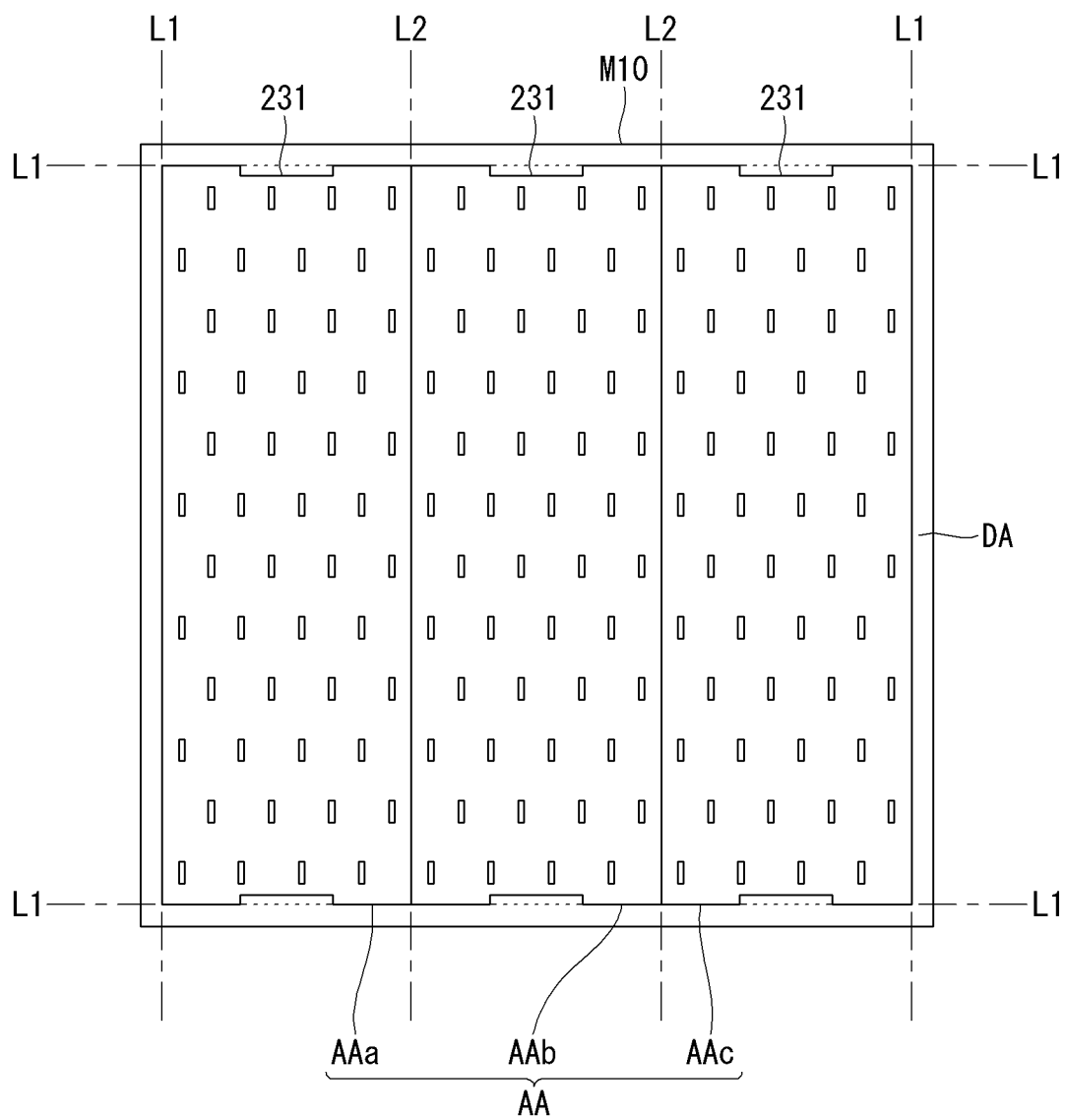

In one example of the present invention, as shown in FIG. 15, a groove 231 is formed in a position deviated from the first cutting line L1 on the substrate, and a connecting portion 34 is disposed in the groove portion 231. It is possible to prevent the connection portion 231 from being damaged even if the mother substrate M10 is cut along the first cutting line L1.

In the step S30, the mother substrate M10 and the protective film formed thereon are cut together. As described above, since the mother substrate M10 and the protective film are cut at the same time in one example, the appearance of the solar cell module can be made simple and aesthetically pleasing.

Hereinafter, the solar cell module according to the second embodiment will be described.

Figure 16:
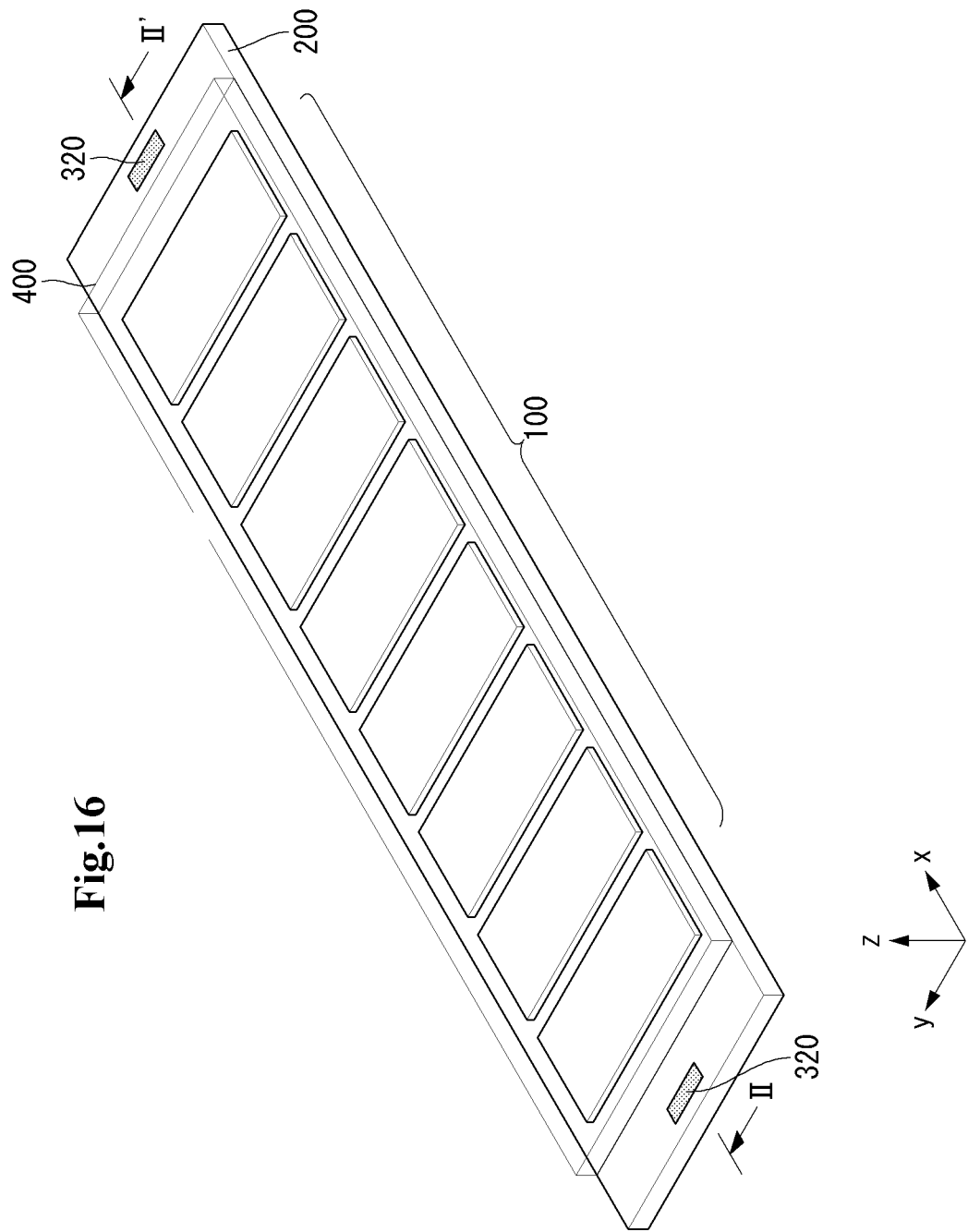
FIG. 16 shows a layout of a solar cell module according to another embodiment of the present invention.
Figure 17:
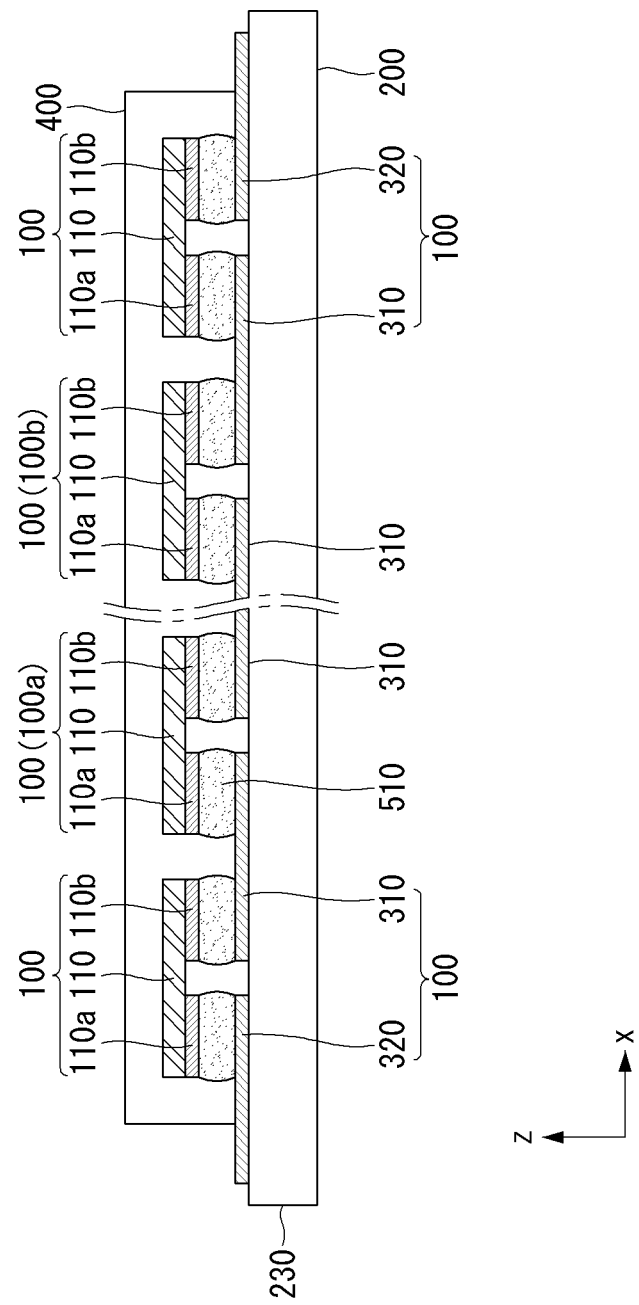
FIG. 17 schematically shows a cross section taken along the line II-II' in FIG. 16.
Figure 18:
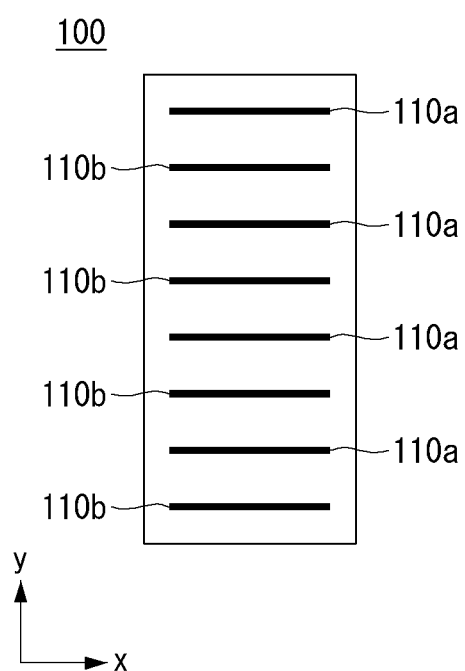
FIG. 18 shows a rear view of the solar cell according to an embodiment of the present invention.

FIG. 16 shows a layout of a solar cell module according to a second embodiment of the present invention. FIG. 17 schematically shows a cross section taken along the line II-II' in FIG. 16. Here, FIG. 17 shows the positions of the first electrode and the second electrode that may be different from the actual arrangement for convenience of explanation. The actual arrangement of the first electrode and the second electrode can be as shown in FIG. 18.

The solar cell module of the second embodiment includes a plurality of solar cells 100 (e.g., small sized solar cells), a substrate 200 connecting the solar cells 100 to each other, and a protective film 400 formed on the front surface of the substrate 100.

In an embodiment, the solar cell 100 includes a first electrode 110a and a second electrode 110b which collect different charges, both of which are arranged on one side of the semiconductor substrate 110, such as back contact solar cell or MWT (Metal Wrap Through) solar cell.

In the first embodiment, a plurality of solar cells 100 are mounted on the substrate 200 and electrically connected to each other. The reason why the divided solar cells are mounted on one substrate 200 is that the total output loss of the solar cell module can be reduced. The output loss has a value obtained by multiplying the square of the current in the solar cell by the resistance, and a current generated by the area of the solar cell itself exists in the current of the solar cell. Therefore, when the area of the solar cell is increased, the corresponding current is also increased, and when the area of the solar cell is decreased, the corresponding current is also decreased. Therefore, as the area of the solar cell decreases, the output loss can be reduced. Therefore, when the solar cells are divided into smaller units and connected to each other as in the embodiment of the present invention, the output of the solar cells can be increased more than that of one solar cell formed on the entire substrate.

Since the solar cell 100 is electrically connected to the substrate 200 in a state of being mounted on the substrate 200, the solar cell module can be constructed to have mechanical strength, and a plurality of solar cells 100 can be easily and simply connected. In this embodiment, since the first and second electrodes 110a and 110b provided on the solar cell are formed on the rear surface of the semiconductor substrate 110, the solar cell 100 can be bonded to the substrate 200 using flip chip bonding, so that the solar cell module can be easily manufactured.

The substrate 200 includes a conductive pattern 30 for electrically connecting a plurality of solar cells 100 mounted on the substrate 200.

The surface of the substrate may be formed to have achromatic color so as not to be seen from the front. For example, the insulating layer formed on the substrate surface may be formed to include an achromatic pigment so that the surface of the substrate is not visible.

The conductive pattern 300 may be formed on the substrate 200 by printing a conductive material such as copper. The substrate 200, in an embodiment, can be implemented as a printed circuit board, referred to as a PCB (Printed Circuit Board) substrate. Such a printed circuit board is printed with a conductive pattern of copper on the surface thereof, and can be preferably used as the substrate 200.

In an embodiment, the conductive pattern 300 is covered by an insulating layer formed on the substrate and can be configured to selectively expose only the necessary portion through the contact hole. The conductive pattern 300 may be exposed by the contact hole and selectively connected to the electrodes of the solar cell by the solder 510 or the conductive adhesive.

In FIG. 17, the insulating layer is omitted in order to show the bonding relation between the conductive pattern 300 and the electrodes 110a and 110b.

In an embodiment, the conductive pattern 300 includes a plurality of conductive portions 310 arranged in a first direction (x-axis direction in the drawing), and a plurality of electrode portions 320 formed on both side edges of the plurality of conductive portions 310 in the first direction.

The electrode portion 320 functioning as an electrode can be formed on the same surface of the side surface 230 of the substrate 100 as the surface on which the conductive portion 310 is formed and can be configured to be exposed to the outside.

The width of the protective film 400 can be smaller than the width of the substrate 200 and the protective film 400 may be formed to selectively cover only a plurality of the solar cells 100. Accordingly, a part of both side edges of the substrate 200 can be exposed to the outside, and the electrode portion 320 can be exposed to the outside by disposing the electrode portion 320 in the opened area.

Further, a transparent protective film 40 is formed on the front surface of the substrate 20 to seal a plurality of solar cells. The protective film 40 may be formed of a transparent polymer such as ethylene-vinyl acetate (EVA) or ethylene tetrafluoroethylene (ETFE), and is preferably formed only on the front surface. Since the protective film 140 is formed only on the front surface, the thickness of the module can be reduced to make the solar cell module slim.

In addition, the protective film 400 can be configured to have an achromatic hue so as not to be easily seen in consideration of design.

FIG. 18 shows a rear surface of a solar cell used in the second embodiment of the present invention.

As exampled in FIG. 18, in one embodiment of the present invention, the first electrode 110a and the second electrode 110b are elongated in a first direction (x-axis direction in the figure) and are arranged in parallel with the neighboring one. In the second direction (y-axis direction in the figure), the first electrode 110a and the second electrode 110b may be alternately arranged.

Figure 19:
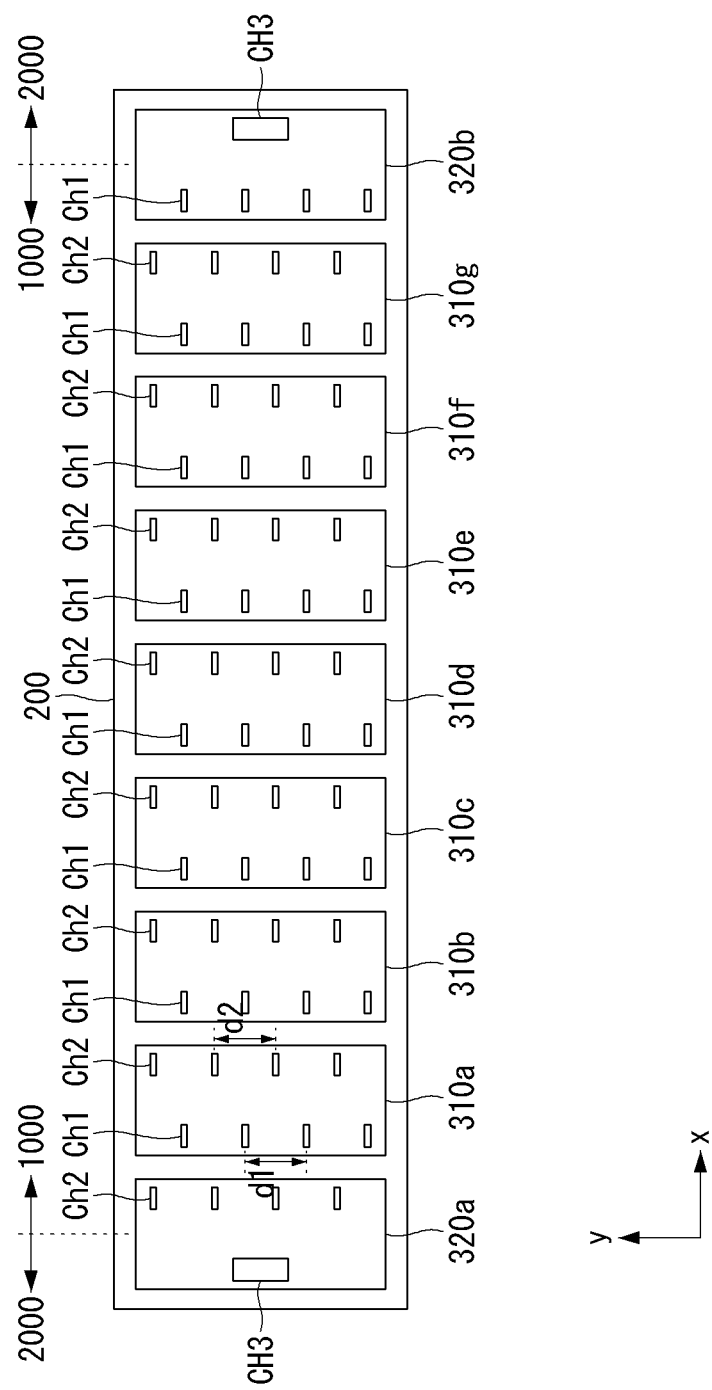
FIG. 19 shows a conductive pattern formed on the front surface of the substrate according to according to an embodiment of the present invention.

FIG. 19 shows a conductive pattern formed on the front surface of the substrate according to the second embodiment.

Referring to FIG. 19, in the second embodiment, the conductive pattern 300 includes a conductive portion 310 disposed on the front surface of the substrate 200 and an electrode portion 320 formed on both side edges of the conductive portion.

The conductive portion 310 and the electrode portion 320 can each have a rectangular flat plate shape and the conductive portion 310 and the electrode portion 320 can be formed to have the same size and shape.

Further, the substrate 200 can be divided into a first region 2000 in which the protective film is not disposed and adjacent to the side surface of the substrate, and a second region 1000 in which the protective film is disposed. The plurality of conductive portions 310 can be located in the second area 1000 and the electrode portion 320 may be disposed in the first area 2000 and the second area 1000.

The plurality of conductive portions 310 are disposed apart from each other in the first direction (x-axis direction in the figure) by a first distance s1, and the conductive portions are physically separated from each other.

The electrode portion 320 can be spaced apart from the conductive portion 310 by a second gap s2 and the second gap s2 can be equal to the first gap s1.

The conductive portion 310 is located between two neighboring solar cells in the first direction and electrically connects them. The electrode portion 320 functions as an electrode and functions as an electrode for input and output of a plurality of solar cells connected by the conductive portion 310.

In the second embodiment, the conductive portions 310 and the electrode portions 310 are disposed on the same surface, for example, the front surface of the substrate 200, so that neighboring solar cell modules can be easily connected.

In the second embodiment, the conductive pattern 300 formed on the front surface of the substrate 200 is covered with an insulating layer, and only a part of the conductive pattern 300 is exposed by the contact hole to come into contact with the electrode of the solar cell.

In one example, this insulating layer can be formed over the entire front surface of the substrate 20, and is omitted in the drawings for convenience of explanation.

In the second embodiment, the contact hole can include a first contact hole ch1, a second contact hole Ch2, and a third contact hole Ch3.

A plurality of first contact holes ch1 are formed to expose a left portion of a conductive portion in each of the conductive portions 310a to 310g, and are spaced apart from each other in a second direction (y-axis direction in the drawing). Here, the distance d1 between the first contact holes ch1 may be substantially the same distance as the distance between the second electrode (or the first electrode).

The first contact hole ch1 is further formed to expose a left portion of the second electrode portion 320b disposed on the right side of the substrate.

The plurality of second contact holes Ch2 are formed to expose a part of the right side of each of the conductive portions 310a to 310g and are spaced apart from each other by a predetermined distance d2 in the second direction, respectively. Here, the distance d2 between the second contact holes Ch2 is substantially equal to the distance d1 between the first contact holes Ch1.

In addition, the second contact hole Ch2 is further formed to expose a portion of the right side of the first electrode portion 320a disposed on the left side surface of the substrate.

The first contact hole Ch1 and the second contact hole Ch2 are not located on the same line in the first direction (the longitudinal direction of the electrode in the x-axis direction of the drawing), and are shifted by a certain distance. Here, the shifted distance is substantially equal to the distance between the first electrode and the second electrode.

Accordingly, the first contact hole ch1 and the second contact hole Ch2 are located alternately in the second direction, like the first electrode and the second electrode, and the distance between the first contact hole and the second contact hole is substantially equal to the distance between the first electrode and the second electrode.

The alternating order and spacing of the first electrode and the second electrode formed on the solar cell are the same as the first contact ch1 and the second contact Ch2. For example, in each of the plurality of solar cells, the first electrode may be connected to the conductive portion via the second contactor Ch2 and the second electrode may be connected to the conductive portion via the first contactor Ch1.

In addition, the contact hole further includes a third contact hole CH3 exposing a part of the electrode portions 320a, 320b.

In the first electrode portion 320a, the third contact hole ch3 is spaced a predetermined distance from the second contact hole Ch2 in the first direction (x-axis direction in the drawing), and a part of the first electrode portion 320a is exposed to the outside. Since the protective film 400 is not formed on the first region 1000 of the substrate 200 at the position where the third contact hole CH3 is formed, A part of the first electrode portion 320a may be exposed to the outside to constitute an electrode of the module.

In an embodiment, the size of the third contact CH3 is larger than the size of the first or second contact hole so that the area of the conductive pattern exposed by the third contact CH3 is larger than the size of the first or second contact hole Ch1, Ch2. Therefore, when the wiring member such as a ribbon or a wire is bonded to the first electrode portion 32a via the third contact hole CH3, a sufficient bonding area can be 1| provided.

Figure 20:
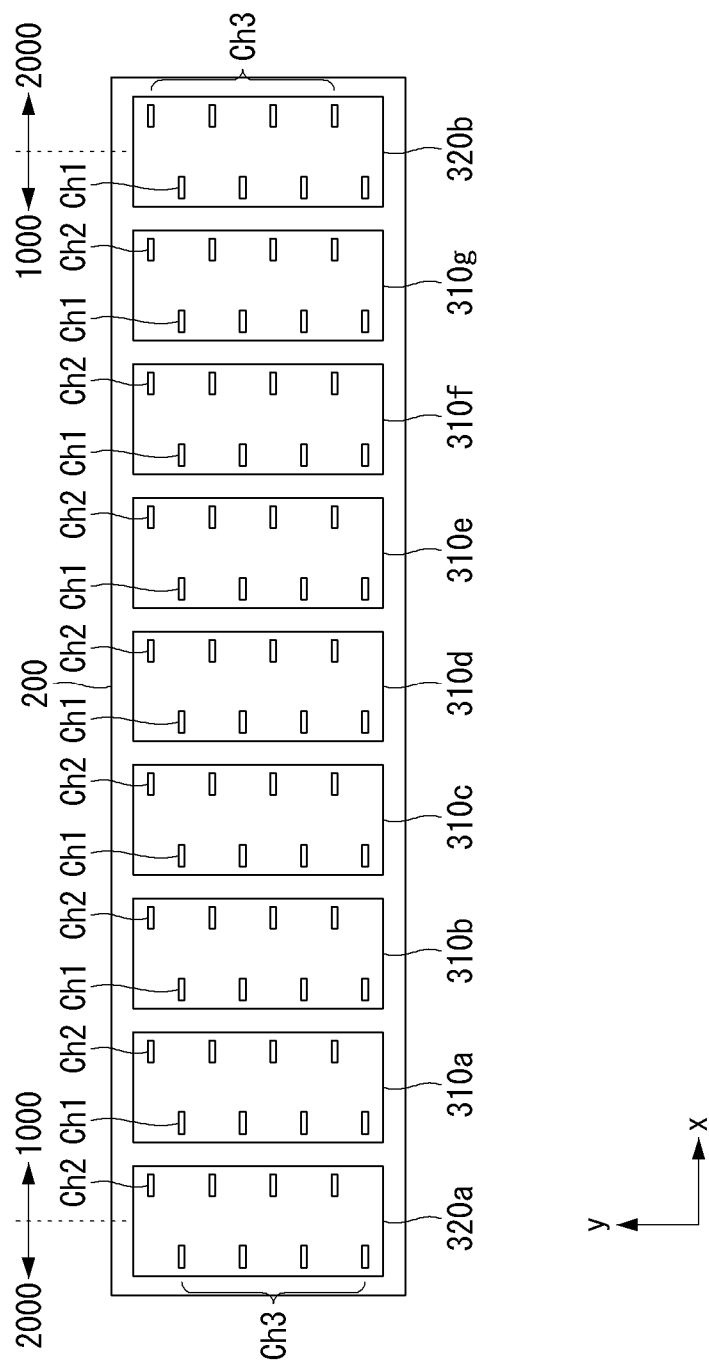
FIGS. 20 and 21 are views illustrating various examples of the third contact hole according to embodiments of the present invention.
Figure 21:
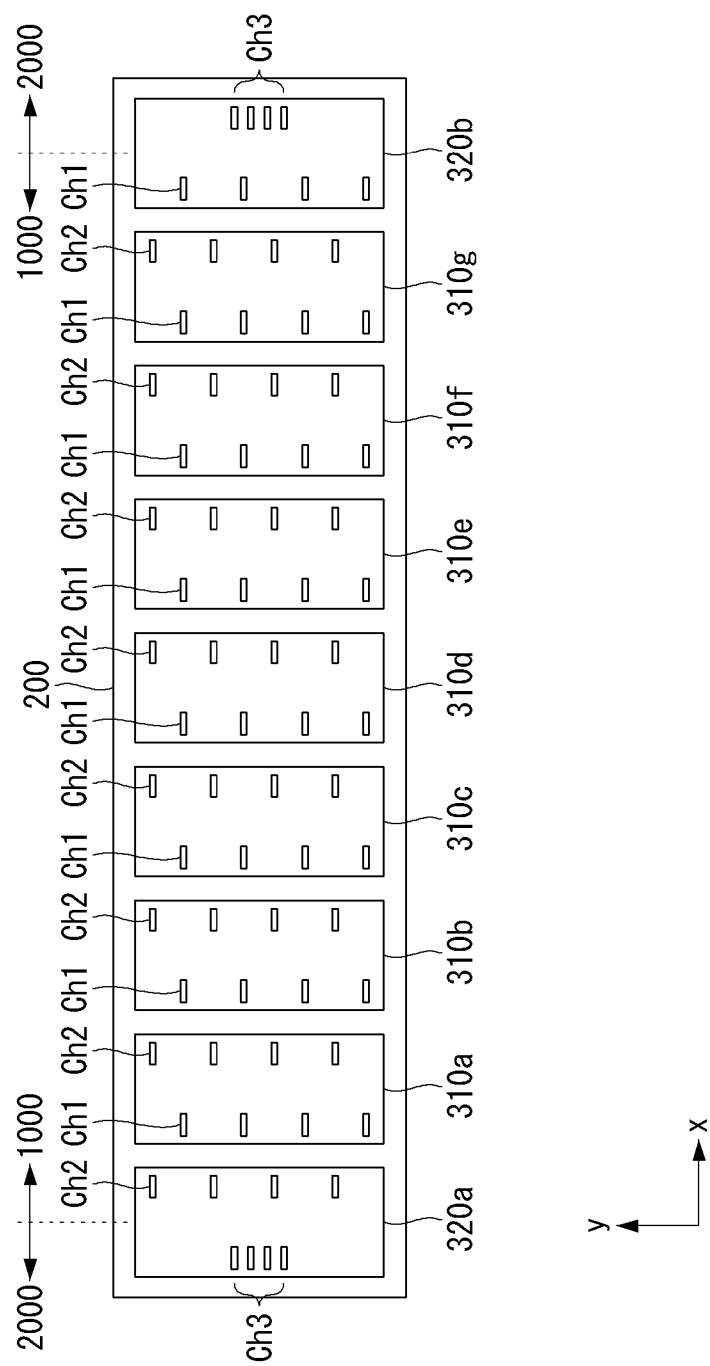

For example, the wiring can be a ribbon having a strip shape, and FIGS. 20 and 21 are views illustrating various examples of the third contact hole.

As illustrated in FIG. 20, the third contact Ch3 can be formed of any one of the first contact ch1 and the second contact ch1. In this instance, the shape of the third contact hole has the same shape as that of the first contact hole Ch1 or the second contact hole Ch1 to increase productivity.

Alternatively, as illustrated in FIG. 21, the third contact Ch3 may be formed such that the distance between the contact holes is made denser than the first or second contact member, or vice versa.

As such, the third contact Ch3 can be formed to have various shapes without particular limitation as long as it can expose a part of the electrode portion.

Figure 22:
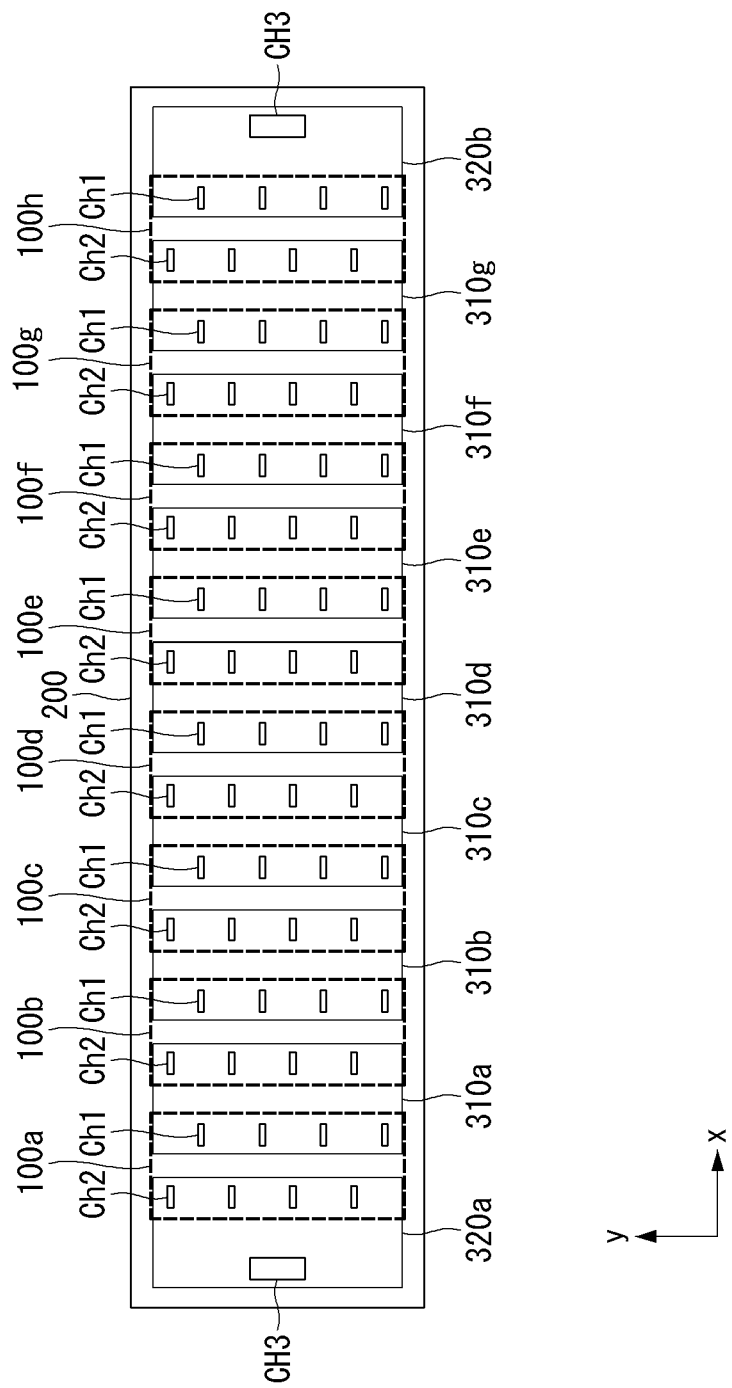
FIG. 22 shows a layout of a substrate and a solar cell according to an embodiment of the present invention.

Hereinafter, referring to FIG. 22, how the conductive pattern and the solar cell are connected in the second embodiment will be described. FIG. 22 shows a layout of a substrate and a solar cell.

In FIG. 22, a plurality of solar cells 100a to 100h are connected to each other by first to seventh conductive portions 310a to 310g.

For example, the left part of the second solar cell 100b is located on the right side of the first conductive portion 310a, and the right part of the second solar cell 100b is located on the left side of the second conductive portion 310b. With this arrangement, the second solar cell 100b is configured such that the second electrode 110b is connected to the first conductive portion 310a by the second contact hole Ch1 provided on the right side of the first conductive portion 310a.

In the second solar cell 100b, the first electrode 110a is connected to the second conductive portion 310b by the first contact hole Ch1 provided on the left side of the second conductive portion 310b.

The third solar cell 100c adjacent to the second solar cell 100b is arranged to face the left side of the third conductive portion 310c and the right side of the second conductive portion 310b. With this arrangement, the second electrode 110b of the third solar cell 100c is connected to the second conductive portion 310b through the second contact ch2. As a result, the second and third solar cells 100b and 100c can be connected in series by the second conductive portion 310b.

The second to sixth conductive portions connect the second to seventh solar cells 100b to 100g in series in the same manner.

The first solar cell 100a overlaps with a part of the right side of the first electrode portion 320a and a part of the left side of the first conductive portion 310a.

As described above, the first electrode 110a of the first solar cell 100a located at the beginning of the plurality of solar cells is connected to the first conductive portion 310a via the first contact hole ch1 so that the first solar cell 100a is connected in series with the second solar cell 100b.

The second electrode 110b of the first solar cell 100a is connected to the first electrode portion 320a via the second contact hole Ch2.

The eighth solar cell 100h positioned at the end of the plurality of solar cells is positioned so that the left side overlaps with a part of the seventh conductive portion 310g and the right side overlaps with the second electrode portion 320b. In this state, the second electrode of the eighth solar cell 100h is connected to the seventh conductive portion 31g via the second contact hole Ch2 formed on the right side of the seventh conductive portion 310g and the first electrode of the eighth solar cell 10h is connected to the second electrode portion 320b via the first contact hole ch1.

Thus, the plurality of solar cells 10a to 10h are connected to each other by the first to seventh conductive portions 31a to 31g.

Figure 23:
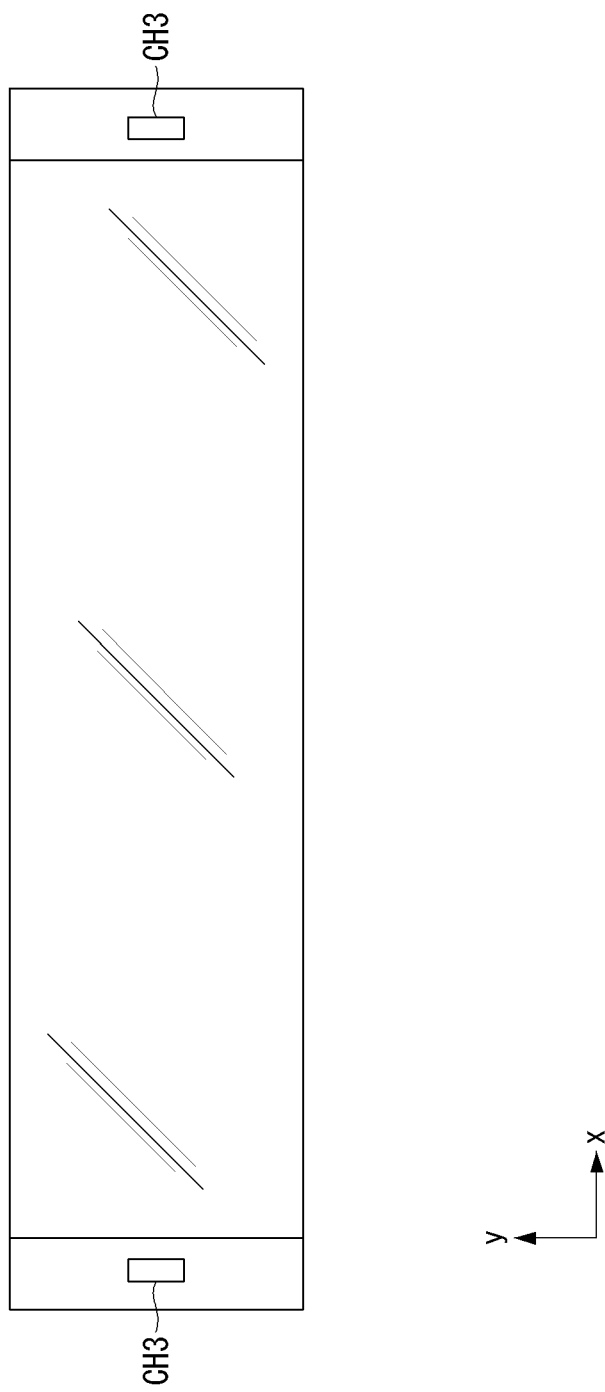
FIG. 23 shows a plan view of the solar cell module according to another embodiment of the present invention.

FIG. 23 shows a plan view of the solar cell module according to the second embodiment. In the solar cell module according to the second embodiment, the electrode portion can be formed on the side edge of the substrate while being exposed to the outside.

Therefore, when the solar cell modules are connected to each other, the electrode portion is located on the front surface of the module rather than on the rear surface, so that it is convenient to connect the two adjacent solar cell modules.

Figure 24:
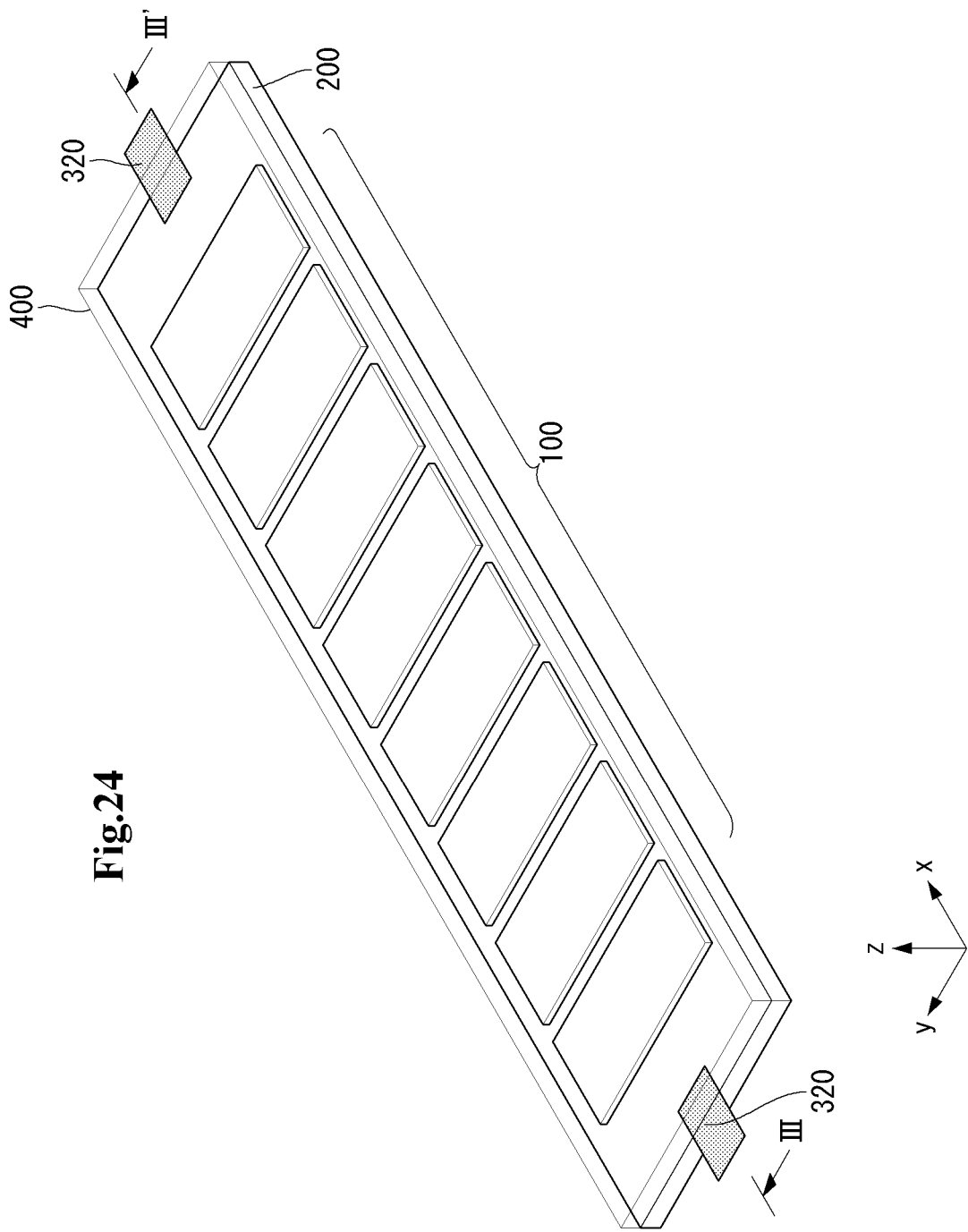
FIG. 24 illustrates a solar cell module according to an embodiment of the present invention.
Figure 25:
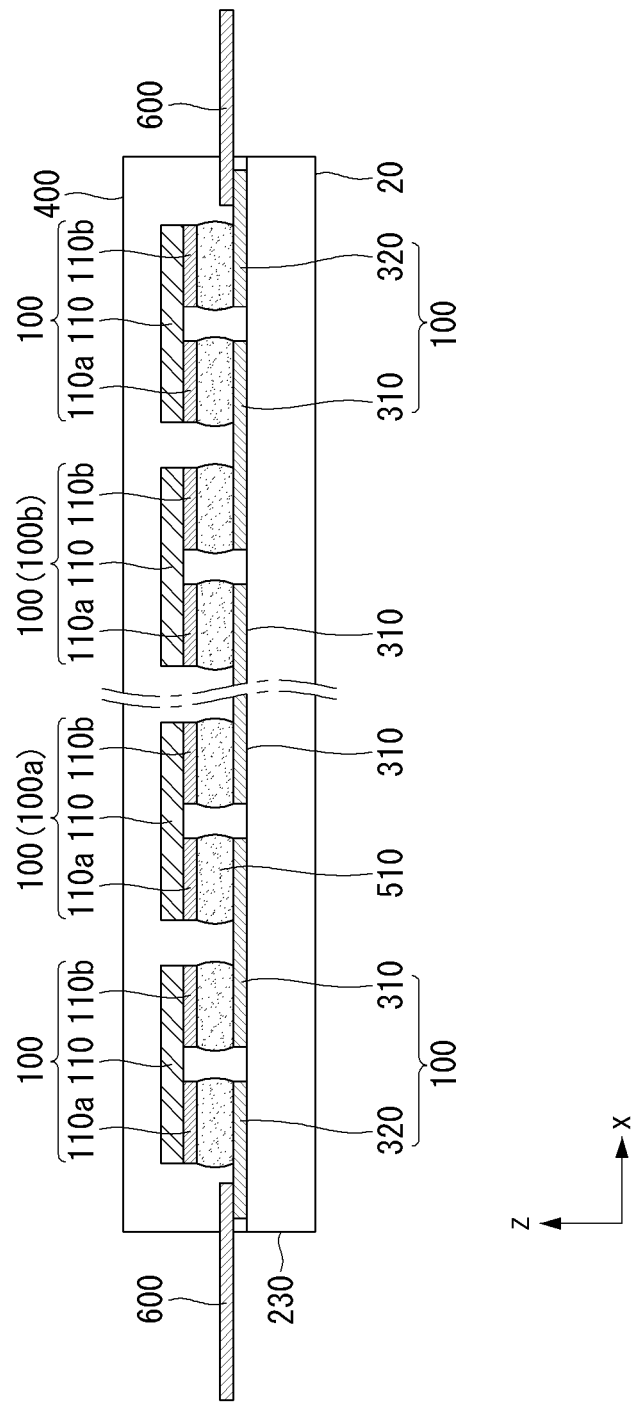
FIG. 25 schematically shows a cross section taken along line in FIG. 24 according to an embodiment of the present invention.

FIG. 24 illustrates a solar cell module according to a third embodiment of the present invention. FIG. 25 schematically shows a cross section taken along line in FIG. 24.

Referring to FIGS. 24 to 25, the solar cell module according to the third embodiment is the same as the solar cell module according to the second embodiment that includes a substrate, a conductive pattern formed on the substrate, and a transparent film.

However, the transparent film 400 differs from the second embodiment in that the transparent film 400 is formed to cover the entire substrate 200 in this embodiment.

As illustrated in FIG. 24, the wiring member 600 is bonded to the electrode portion 320. Here, the wiring member 600 can be a strip-shaped ribbon. Ribbon refers to a wire made of copper coated with tin or the like.

The end portion of the wiring member 600 is soldered to the electrode portion, and is formed to be long in the first direction and protruded out of the solar cell module.

Since the portion where the wiring member 600 and the electrode portion 320 are joined is sealed by the protective film 400 in the third embodiment, the bonding region between the wiring member 600 and the electrode portion 320 is prevented from being damaged.

In addition, since the solar cell module of this embodiment includes wiring member, there is an advantage that connection between the solar cell modules is simple.

Hereinafter, a method of manufacturing the solar cell module according to the third embodiment will be described.

Figure 26:
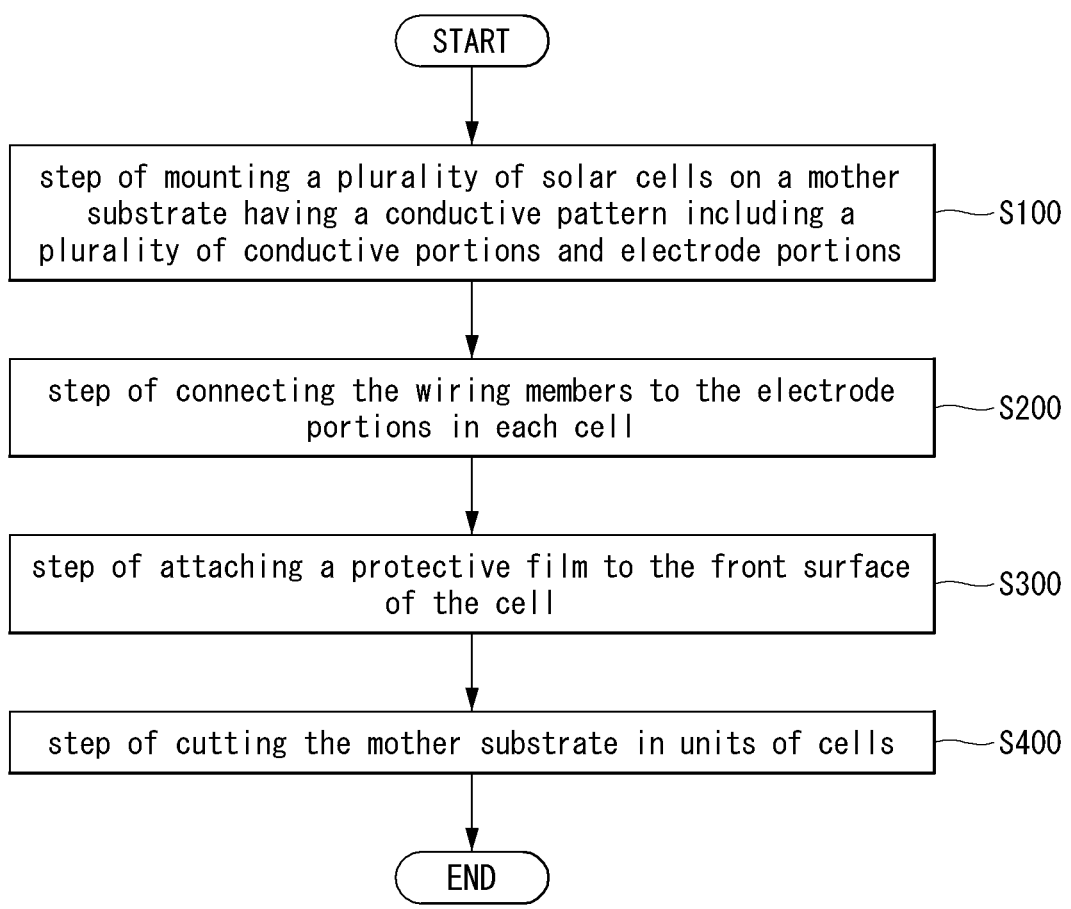
FIG. 26 is a flowchart illustrating a manufacturing method of a solar cell module according to an embodiment of the present invention.

FIG. 26 is a flowchart illustrating a manufacturing method of a solar cell module according to a third embodiment of the present invention.

As shown in FIG. 26, the manufacturing method of the solar cell module according to the third embodiment includes a step S100 of mounting a plurality of solar cells on a mother substrate having a conductive pattern including a plurality of conductive portions and electrode portions, the step S200 of connecting the wiring members to the electrode portions in each cell, the step S300 of attaching a protective film to the front surface of the cell, and the step S400 of cutting the mother substrate in units of cells, wherein a part of the wiring member may be exposed to the outside of the protective film in step S400, and the electrode portion to which the wiring is bonded may be sealed with the protective film.

Here, the order of steps S300 and S200 may be changed.

In step S100, the solar cells can be attached to the mother substrate M100 through reflow soldering or flow soldering. Since reflow soldering or flow soldering is a well-known in the related art, detailed description thereof will be omitted.

In the reflow soldering, a cream-like solder (or called a solder cream) is printed as a conductive pattern formed on the mother substrate, and a plurality of solar cells are placed thereon and moved to a hot air circulating apparatus. In the hot air circulating apparatus, the solar cell is soldered to the mother substrate.

Figure 27:
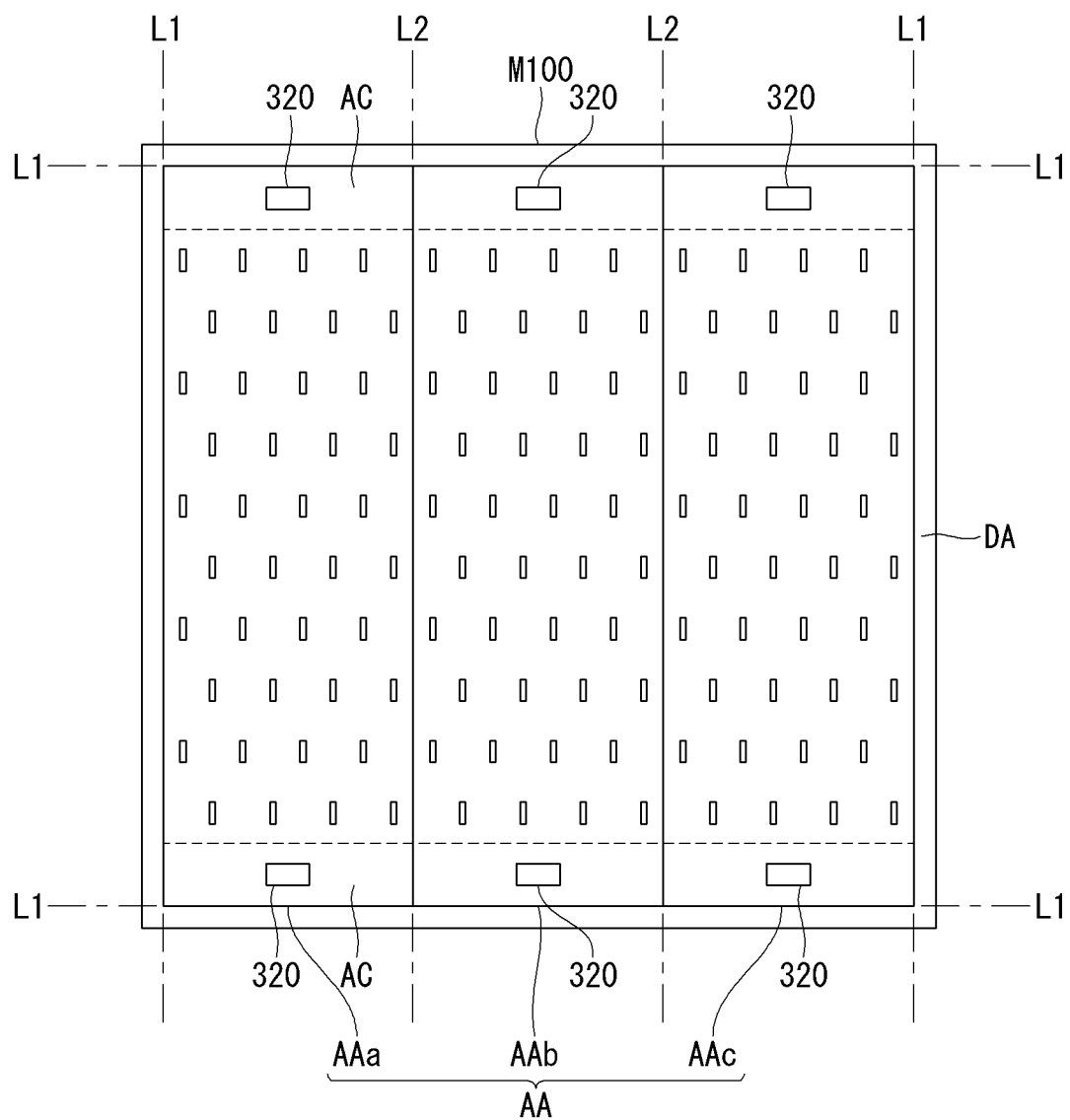
FIG. 27 is a view illustrating a mother substrate used in the manufacturing method of FIG. 26 according to an embodiment of the present invention.

FIG. 27 is a plan view of the mother substrate.

As shown, the mother substrate M100 can be composed of a printed circuit board. The mother substrate M100 includes an active region AA in which the solar cell is mounted, a dummy region DA surrounding the periphery of the active region AA, and a junction region AC in which the electrode portion is formed.

The dummy area DA is removed from the mother substrate M100 in the step S300 of dividing the mother substrate M100 into a plurality of solar cell modules as an area for the process margin.

In addition, the active area AA can be divided into a plurality of cells AAa to AAc. In each cell, a plurality of solar cells are connected by a conductive pattern to form a string.

Further, the bonding region AC is a selective region, which is exposed to the outside without attaching the protective film. In one embodiment, the electrode portion 320 may be disposed in the bonding region AC and exposed to the outside of the solar cell module.

Here, the mother substrate M100 can be used as a base substrate for method step S100, the solar cells are mounted on the mother substrate M100 along the conductive patterns formed on the cells AAa to AAc. In one example, the solar cells can be mounted on the mother substrate M100 using the reflow soldering.

Next, in step S200, wire members are connected to the electrode portions 320 of the cells AAa to AAc. Here, the bonding of the wiring members can be preferably used for the soldering method. The wiring members may preferably be a ribbon. The wiring members are attached to the electrode portion 320 to extend to the outside of the substrate long in the longitudinal direction of the substrate.

Next, in step S300, the protective film 400 is attached to the entire surface of each of the cells AAa to AAc, that is, the surface on which the solar cell is mounted. At this time, the protective film 400 is attached to the entire front surface of the mother substrate M100.

In an embodiment, the protective film 400 can be laminated to the substrate 200 in a vacuum. This vacuum laminating is performed in a chamber equipped with a vacuum facility. After the chamber is vacuumed to a certain level or higher, the protective film 400 is adhered to the entire surface of the substrate by thermo-compression using a laminating apparatus. Therefore, the protective film 400 can be adhered to the substrate 200 in a clean manner by preventing pollutants from flowing in the laminating process.

In this step S300, the protective film 400 is formed on the entire front surface of the mother substrate M100.

Next, in step S400, the mother substrate M100 is divided into a plurality of solar cell modules. The mother substrate M10 is divided into a plurality of solar cell modules by mechanical cutting using a saw, a method of using a device for forming fine holes or V-shaped groove in the substrate, a method of using a laser and or various cutting methods well known related art.

The mother substrate M100 can be cut along the first cutting line L1 and the second cutting line L2 as shown in FIG. 27. The first cut line L1 divides the active area AA and the dummy area DA and the second cut line L2 divides the plurality of cells AAa to Ac belonging to the active area AA.

In an embodiment, the mother substrate M100 and the protective film formed thereon are cut together. As described above, since the mother substrate M100 and the protective film are cut at the same time in one example, the appearance of the solar cell module can be made simple.

Figure 28:
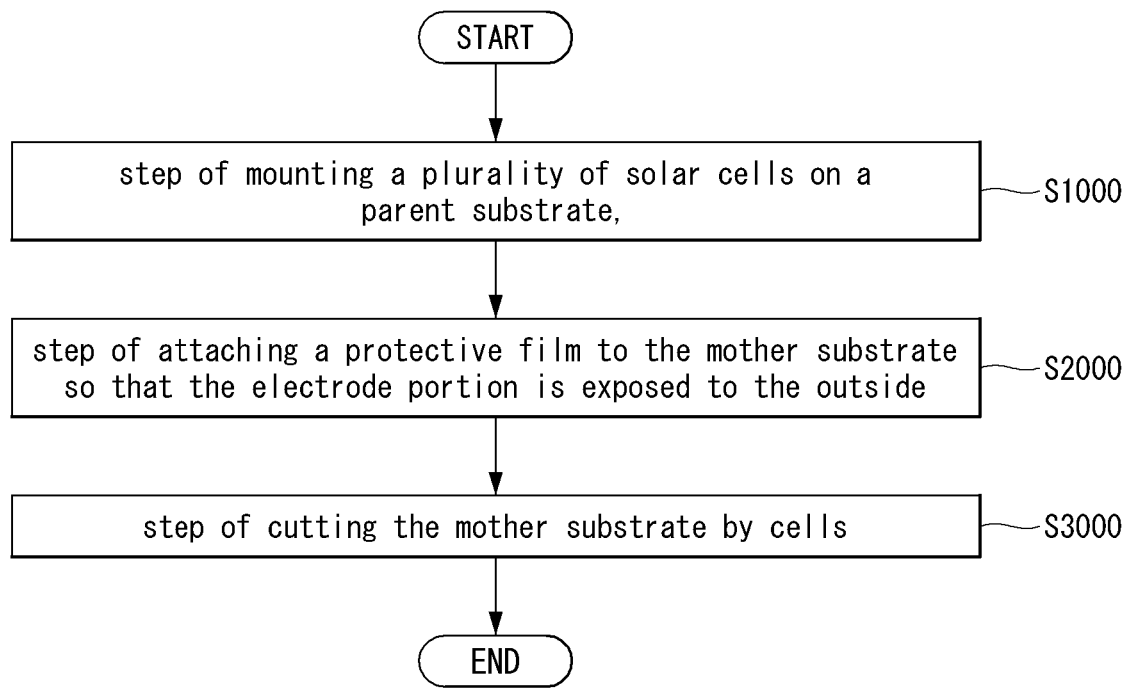
FIG. 28 is a flowchart illustrating a method of manufacturing a solar cell module according to an embodiment of the present invention.

Hereinafter, a manufacturing method of the solar cell module according to the second embodiment of the present invention will be described with reference to FIG. 28. The following manufacturing method also relates to a manufacturing method of the solar cell module according to the second embodiment.

The manufacturing method of this embodiment includes the step S1000 of mounting a plurality of solar cells on a parent substrate, the step S2000 of attaching a protective film to the mother substrate so that the electrode portion is exposed to the outside, the step S3000 of cutting the mother substrate by cells.

Since the step S1000 is the same as the step S10, detailed description thereof will be omitted.

Next, in step S2000, the protective film 400 is attached to the surface of each of the cells AAa to AAc, that is, the surface on which the solar cell is mounted. At this time, the protective film 400 is attached to a region except the bonding region AC of the mother substrate M100, and exposes the electrode portion 320 to the outside.

In an embodiment, the protective film 400 can be laminated to the substrate 200 in a vacuum.

Next, in step S3000, the mother substrate M100 is divided into a plurality of solar cell modules. The mother substrate M10 is divided into a plurality of solar cell modules by mechanical cutting using a saw, a method of using a device for forming fine holes or V-shaped groove in the substrate, a method of using a laser and or various cutting methods well known related art.

Here, the mother substrate M100 can be cut along the first cutting line L1 and the second cutting line L2 as shown in FIG. 27. The first cut line L1 divides the active area AA and the dummy area DA and the second cut line L2 divides the plurality of cells AAa to Ac belonging to the active area AA.

The features, structures, effects and the like according to the embodiments described above are included in at least one embodiment of the present invention, and are not necessarily limited to only one embodiment. Further, the features, structures, effects and the like illustrated in the embodiments can be combined and modified by other persons skilled in the art to which the embodiments belong. Therefore, it is to be understood that the present invention is not limited to these embodiments.

What is claimed is:

1. A solar cell module comprising:
a PCB (Printed Circuit Board) substrate having a conductive pattern on a front surface and a rear surface thereof;
a plurality of solar cells mounted on the PCB substrate and arranged in a first direction, each of the plurality of solar cells including a first electrode and a second electrode arranged in parallel on a rear surface of a semiconductor substrate, wherein the first electrode and the second electrode are extended in the first direction, alternately arranged in a second direction crossing the first direction, and spaced apart from one another in the second direction,
wherein each of the plurality of solar cells is mounted so that the first and second electrodes face the conductive pattern, and the PCB substrate electrically connects the plurality of solar cells with each other; and
a protective film encapsulating the plurality of solar cells on the front surface of the PCB substrate,
wherein the conductive pattern includes:
a plurality of conductive portions, each of the plurality of conductive portions being arranged on the front surface of the PCB substrate and between two adjacent solar cells among the plurality of solar cells in a direction of a thickness of the solar cell module to electrically connect the two adjacent solar cells among the plurality of solar cells,
a terminal portion arranged on the front surface of the PCB substrate and adjacent to an outer conductive portion of the plurality of conductive portions, wherein the terminal portion is electrically connected to the outer conductive portion of the plurality of conductive portions by the semiconductor substrate of one of the plurality of solar cells,
an electrode portion formed on the rear surface of the PCB substrate, wherein the electrode portion forms an electrode for connecting the solar cell module to an external load, and
a connection portion proximate an outermost side surface of the PCB substrate, wherein the connection portion directly and electrically connects the terminal portion to the electrode portion of the conductive pattern,
wherein the PCB substrate comprises a groove portion recessed inwardly from the outermost side surface of the PCB substrate, wherein the front surface of the PCB substrate has a minimum width measured in the second direction that is defined by the groove portion, wherein the rear surface of the PCB substrate has a minimum width measured in the second direction that is defined by the groove portion,
wherein the connection portion is disposed in the groove portion, wherein an outermost surface of the connection portion is offset from the outermost side surface of the PCB substrate in the second direction such that the connection portion does not protrude from the outermost side surface of the PCB substrate,
wherein each of the plurality of solar cells and each of the plurality of conductive portions is a rectangular shape having a first side and a second side in the first direction,
wherein each of the plurality of conductive portions is disposed on the PCB substrate such that a first side of the conductive portion overlaps with a second side of a first solar cell and a second side of the conductive portion overlaps with a first side of a second solar cell, wherein the first and second solar cells are among the two adjacent solar cells in the first direction,
wherein the PCB substrate further comprises an insulating layer covering the plurality of conductive portions on the front surface of the PCB substrate, and
wherein the insulating layer includes a first contact hole to be disposed at a corresponding first side of the conductive portion and to expose the second electrode of the first solar cell and a second contact hole to be disposed at a corresponding second side of the conductive portion and to expose the first electrode of the second solar cell.

2. The solar cell module of claim 1, wherein each of the plurality of conductive portions has a same size and a same shape.

3. The solar cell module of claim 2, wherein each of the plurality of conductive portions has a flat plate shape equal to a shape of each of the plurality of solar cells.

4. The solar cell module of claim 1, wherein a depth of the groove portion is greater than thickness of the connection portion such that the connection portion does not protrude from the outermost side surface of the PCB substrate, and wherein the depth of the groove portion is measured in the second direction.

5. The solar cell module of claim 1, wherein the first contact hole and the second contact hole are arranged non-collinear in the first direction.

6. The solar cell module of claim 1, wherein the protective film is formed only on the front surface of the PCB substrate.

7. The solar cell module of claim 6, wherein an end of the protective film and an end of the PCB substrate are formed in parallel.

8. The solar cell module of claim 1, wherein a surface of at least one of the plurality of solar cells is visually invisible or a surface of the PCB substrate is visually invisible.

9. The solar cell module of claim 1, wherein the connection portion comprises a first part and a second part, wherein each part is connected to the electrode portion and proximate the outermost side surface of the PCB substrate, and wherein the first part of the connection portion is spaced apart from the second part of the connection portion in the first direction.

10. The solar cell module of claim 1, wherein the width of the connection portion is equal to the width of the electrode portion, the widths being measured in the first direction.

11. The solar cell module of claim 1, wherein the width of the connection portion is smaller than the width of the terminal portion, the widths being measured in the first direction.

12. A solar cell module comprising:
a PCB (Printed Circuit Board) substrate having a conductive pattern on a front surface and a rear surface thereof; and
a plurality of solar cells mounted on the PCB substrate and arranged in a first direction, each of the plurality of solar cells including a first electrode and a second electrode arranged in parallel on a rear surface of a semiconductor substrate, wherein the first electrode and the second electrode are extended in the first direction, alternately arranged in a second direction crossing the first direction, and spaced apart from one another in the second direction,
wherein the conductive pattern includes:
a plurality of conductive portions, each of the plurality of conductive portions being arranged on the front surface of the PCB substrate and between two adjacent solar cells among the plurality of solar cells in a direction of a thickness of the solar cell module to electrically connect the two adjacent solar cells among the plurality of solar cells,
a terminal portion arranged on the front surface of the PCB substrate and adjacent to an outer conductive portion of the plurality of conductive portions, wherein the terminal portion is electrically connected to the outer conductive portion of the plurality of conductive portions by the semiconductor substrate of one of the plurality of solar cells,
an electrode portion formed on the rear surface of the PCB substrate, wherein the electrode portion forms an electrode for connecting the solar cell module to an external load, and
a connection portion proximate an outermost side surface of the PCB substrate, wherein the connection portion directly and electrically connects the terminal portion to the electrode portion of the conductive pattern,
wherein the PCB substrate comprises a groove portion recessed inwardly from the outermost side surface of the PCB substrate, wherein the front surface of the PCB substrate has a minimum width measured in the second direction that is defined by the groove portion, wherein the rear surface of the PCB substrate has a minimum width measured in the second direction that is defined by the groove portion, and
wherein the connection portion is disposed in the groove portion, wherein an outermost surface of the connection portion is offset from the outermost side surface of the PCB substrate in the second direction such that the connection portion does not protrude from the outermost side surface of the PCB substrate.

13. The solar cell module of claim 12, wherein each of the plurality of solar cells is mounted so that the first and second electrodes face the conductive pattern, and the PCB substrate electrically connects the plurality of solar cells with each other.

14. The solar cell module of claim 12, wherein each of the plurality of conductive portions is disposed on the PCB substrate such that a first side of the conductive portion overlaps with a second side of a first solar cell a the second side of the conductive portion overlaps with a first side of a second solar cell, wherein the first and second solar cells are among the two adjacent solar cells in the first direction.

15. The solar cell module of claim 12, wherein the connection portion comprises a first part and a second part, wherein each part is connected to the electrode portion and to the terminal portion, wherein each part is proximate the outermost side surface of the PCB substrate, and wherein the first part of the connection portion is spaced apart from the second part of the connection portion in the first direction.

16. The solar cell module of claim 12, wherein the width of the connection portion is less than or equal to the width of the electrode portion, the widths being measured in the first direction.

17. The solar cell module of claim 12, wherein the PCB substrate further comprises an insulating layer covering the plurality of conductive portions on the front surface of the PCB substrate.

18. The solar cell module of claim 17, wherein the insulating layer includes a first contact hole to be disposed at a corresponding first side of the conductive portion and to expose the second electrode of a first solar cell and a second contact hole to be disposed at a corresponding second side of the conductive portion and to expose the first electrode of a second solar cell.

19. A solar cell module comprising:
a PCB (Printed Circuit Board) substrate having a conductive pattern on a front surface and a rear surface thereof; and
a plurality of solar cells mounted on the PCB substrate, each of the plurality of solar cells including a first electrode and a second electrode on a rear surface of a semiconductor substrate, wherein adjacent solar cells of the plurality of solar cells are spaced apart in a first direction,
wherein the conductive pattern includes:
a plurality of conductive portions, each of the plurality of conductive portions being arranged on the front surface of the PCB substrate and between two adjacent solar cells among the plurality of solar cells to electrically connect the two adjacent solar cells in the first direction among the plurality of solar cells, a terminal portion arranged on the front surface of the PCB substrate and adjacent to an outer conductive portion of the plurality of conductive portions, wherein the terminal portion is electrically connected to the outer conductive portion of the plurality of conductive portions by the semiconductor substrate of one of the plurality of solar cells, an electrode portion formed on the rear surface of the PCB substrate, wherein the electrode portion forms an electrode for connecting the solar cell module to an external load, and a connection portion proximate an outermost side surface of the PCB substrate, wherein the connection portion directly and electrically connects the terminal portion to the electrode portion of the conductive pattern, wherein the PCB substrate comprises a groove portion recessed inwardly from the outermost side surface of the PCB substrate, and wherein the connection portion is disposed in the groove portion, wherein an outermost surface of the connection portion is offset from the outermost side surface of the PCB substrate in the first direction such that the connection portion does not protrude from the outermost side surface of the PCB substrate.

20. The solar cell module of claim 19, wherein the connection portion comprises a first part and a second part, wherein each part is connected to the electrode portion and to the terminal portion, wherein each part is proximate the outermost side surface of the PCB substrate, and wherein the first part of the connection portion is spaced apart from the second part of the connection portion in the first direction.

* * * * *